United States Patent
Miyazaki

(10) Patent No.: US 11,682,455 B2
(45) Date of Patent: Jun. 20, 2023

(54) SEMICONDUCTOR STORAGE DEVICE

(71) Applicant: Kioxia Corporation, Tokyo (JP)

(72) Inventor: Takayuki Miyazaki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 69 days.

(21) Appl. No.: 17/349,095

(22) Filed: Jun. 16, 2021

(65) Prior Publication Data

US 2022/0084587 A1 Mar. 17, 2022

(30) Foreign Application Priority Data

Sep. 17, 2020 (JP) .............................. JP2020-156661

(51) Int. Cl.
*G11C 13/00* (2006.01)
*H10B 63/00* (2023.01)

(52) U.S. Cl.
CPC .......... *G11C 13/003* (2013.01); *G11C 13/004* (2013.01); *G11C 13/0069* (2013.01);
(Continued)

(58) Field of Classification Search
CPC ............ G11C 16/0408; G11C 16/0433; G11C 16/0441; G11C 19/00; G11C 2207/002; G11C 2213/31; G11C 2213/75; G11C 2213/77; G11C 27/028; G11C 5/14; G11C 7/14; G11C 7/18; G11C 8/12; G11C 11/2275; G11C 13/0061; G11C 13/0064; G11C 15/02; G11C 15/046; G11C 16/24; G11C 2013/0076; G11C 2013/0078; G11C 2013/0083; G11C 2013/0088; G11C 2213/15; G11C 2213/76; G11C 5/08; G11C 5/142; G11C 7/1096; G11C 8/08; H01L 27/115; H01L 27/11521; H01L 45/1233; H01L 27/101; H01L 45/08; H01L 45/146; H01L 27/2418; H01L 27/2481; H01L 27/11526; H01L 27/1156; H01L 27/1225;
(Continued)

(56) References Cited

U.S. PATENT DOCUMENTS 7,245,522 B2 * 7/2007 Aoki ....................... G11C 11/16
365/158
7,936,594 B2 5/2011 Park et al.
(Continued)

FOREIGN PATENT DOCUMENTS

JP 2019-053810 A 4/2019

*Primary Examiner* — Thong Q Le
(74) *Attorney, Agent, or Firm* — Foley & Lardner LLP

(57) ABSTRACT

A memory includes first lines arrayed along a surface of a substrate. Second lines are arrayed along the surface of the substrate either above or below the first lines and intersecting with the first lines. Resistance change memory cells are provided to correspond to intersection regions between the first lines and the second lines, respectively. First switching elements are arranged on a side of first ends of the first lines and transmitting a first voltage for writing or reading data to at least one memory cell among the memory cells. Second switching elements are arranged on a side of second ends of the first lines on an opposite side to the first ends and transmitting the first voltage to at least another one memory cell among the memory cells. The first switching elements and the second switching elements are connected to different ones of the first lines, respectively.

26 Claims, 37 Drawing Sheets

(52) U.S. Cl.
CPC .............. *H10B 63/30* (2023.02); *H10B 63/80* (2023.02); *G11C 2213/79* (2013.01)

(58) Field of Classification Search
CPC ... H01L 27/228; H01L 27/24; H01L 27/2436; H01L 29/7869; H01L 2224/16225; H01L 2224/48091; H01L 2224/73265; H01L 24/97; H01L 25/0753; H01L 27/0207; H01L 27/0688; H01L 27/224; H01L 27/2409; H01L 27/2463; H01L 2924/01322; H01L 2924/12041; H01L 2924/12044; H01L 2924/1301; H01L 2924/13033; H01L 2924/15747; H01L 2924/181; H01L 33/50; H01L 33/504; H01L 45/06; H01L 45/16; H01L 45/1675; H01L 45/1683
USPC ............ 365/230.03, 148, 63, 185.23, 185.29
See application file for complete search history.

(56) References Cited

U.S. PATENT DOCUMENTS

| | | |
|---|---|---|
| 10,236,060 B1 | 3/2019 | Takashima |
| 2009/0279351 A1 | 11/2009 | Park et al. |
| 2012/0092921 A1 | 4/2012 | Ono et al. |
| 2019/0198101 A1 | 6/2019 | Yoon |

* cited by examiner

SEMICONDUCTOR STORAGE DEVICE

CROSS REFERENCE TO RELATED APPLICATIONS

This application is based upon and claims the benefit of priority from the prior Japanese Patent Application No. 2020-156661, filed on Sep. 17, 2020, the entire contents of which are incorporated herein by reference.

FIELD

The embodiments of the present invention relate to a semiconductor storage device.

BACKGROUND

In recent years, resistance change memories such as a PCM (Phase Change Memory) and a ReRAM (Resistive Random Access Memory) have been developed. Since a resistance change memory heats memory cells to perform a write operation, a large write current is required. If the write current is large, a voltage drop caused by resistances of word lines and bit lines becomes large and a sufficiently large voltage cannot be applied to memory cells far from a power source. Therefore, a problem that memory cells far from the power source cannot be efficiently heated occurs.

DETAILED DESCRIPTION

Figure 1:
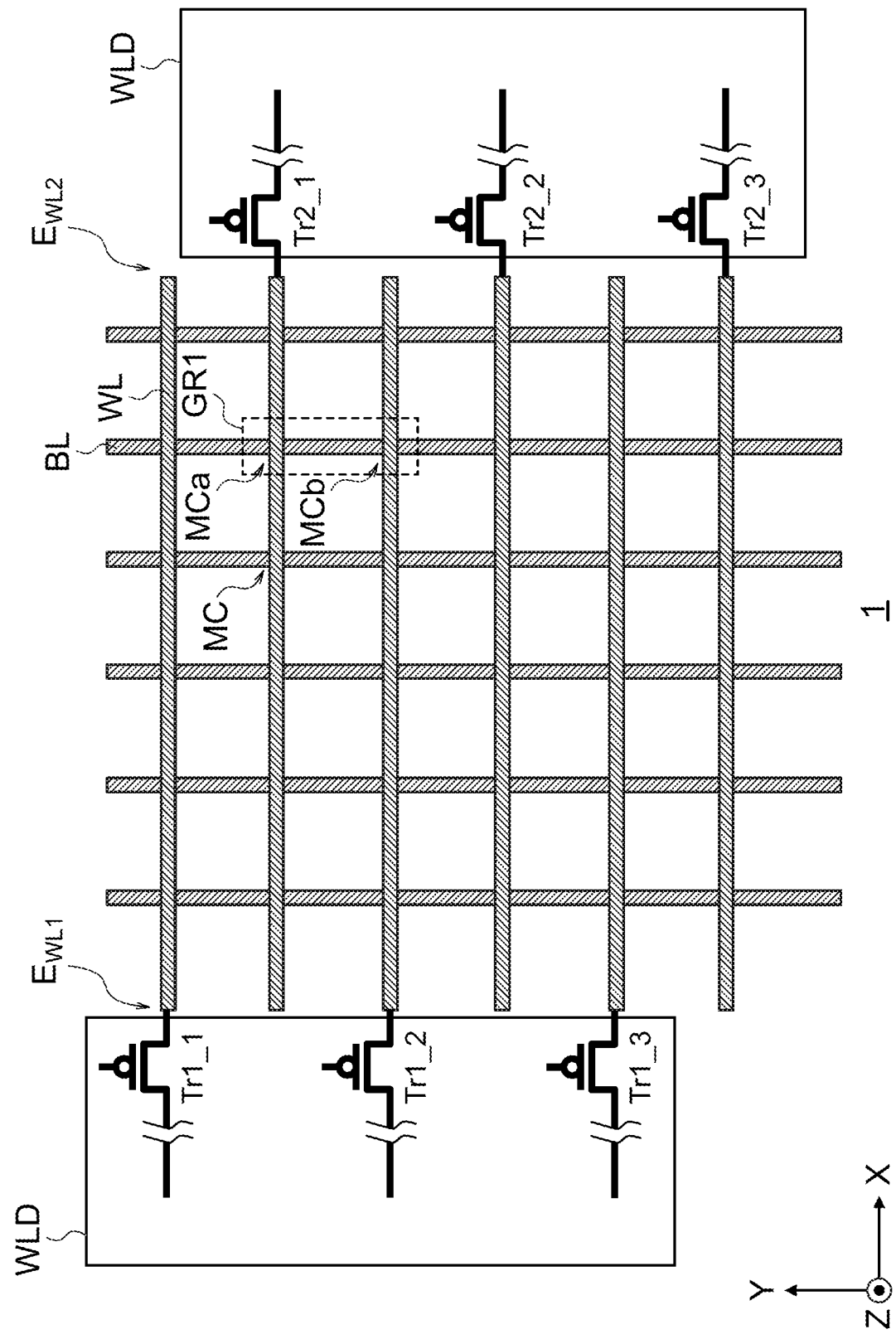
FIG. 1 is a plan view illustrating a configuration example of a semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according the present embodiment comprises a substrate. A plurality of first lines are arrayed along a surface of the substrate. A plurality of second lines are arrayed along the surface of the substrate either above or below the first lines and intersecting with the first lines. A plurality of resistance change memory cells are provided to correspond to intersection regions between the first lines and the second lines, respectively. A plurality of first switching elements are arranged on a side of first ends of the first lines and transmitting a first voltage for writing or reading data to at least one memory cell among the memory cells. A plurality of second switching elements are arranged on a side of second ends of the first lines on an opposite side to the first ends and transmitting the first voltage to at least another one memory cell among the memory cells. The first switching elements and the second switching elements are connected to different ones of the first lines, respectively.

First Embodiment

Figure 2A:
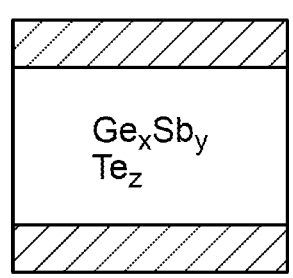
FIGS. 2A and 2B are views schematically illustrating configurations of a memory cell.
Figure 2B:
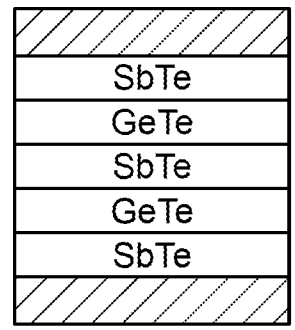
Figure 3A:
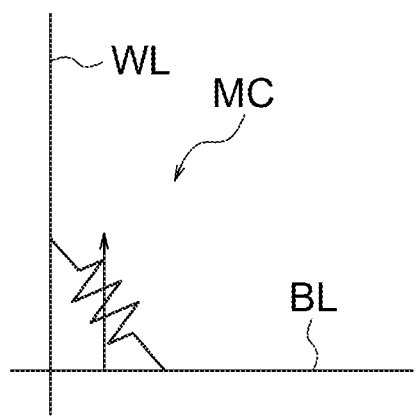
FIGS. 3A to 3C are equivalent circuit diagrams of the semiconductor storage device in which memory cells are used.
Figure 3B:
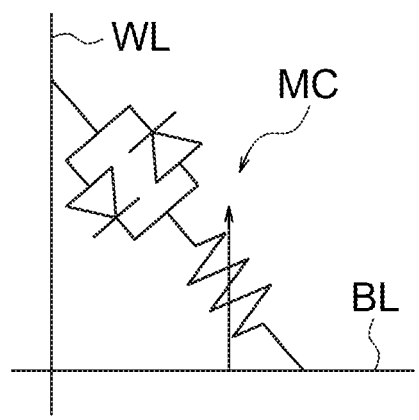
Figure 3C:
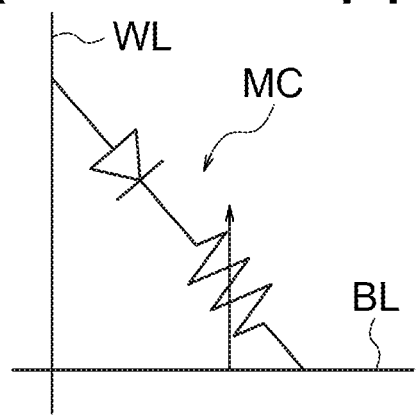

FIG. 1 is a plan view illustrating a configuration example of a semiconductor storage device 1 according to a first embodiment. FIGS. 2A and 2B are sectional views schematically illustrating configurations of a memory cell MC. FIGS. 3A to 3C are equivalent circuit diagrams of a semiconductor storage device in which memory cells MC are used.

The semiconductor storage device 1 is, for example, a nonvolatile resistance change memory such as a PCM or a ReRAM. As illustrated in FIG. 1, the semiconductor storage device 1 includes a plurality of word lines WL, a plurality of bit lines BL, a plurality of memory cells MC, and a word line driver WLD.

The word lines WL extend substantially in parallel to each other in an X direction in a surface (an X-Y plane) of a semiconductor substrate and are arrayed in a Y direction along the surface. The bit lines BL extend substantially in parallel to each other in the Y direction in the X-Y plane and are arrayed in the X direction along the surface. The word lines WL and the bit lines BL intersect with each other (for example, are orthogonal to each other).

The memory cells MC are provided to correspond to intersection regions between the word lines WL and the bit lines BL and are arranged between the word lines WL and the bit lines BL in FIG. 1, respectively. The memory cells MC are resistance change storage elements. When phase change memories (PCMs) are used as the resistance change storage elements, a configuration based on a chalcogenide material (for example, GeSbTe) as illustrated in FIG. 2A, a configuration (SbTe/GeTe/SbTe/GeTe/SbTe) based on a superlattice material as illustrated in FIG. 2B, and the like are used.

The memory cells MC change in the resistance state with supply of a write voltage (a write current). Specifically, the memory cells MC can store therein binary data in two states, that is, a high-resistance state (a reset state) and a low-resistance state (a set state). In order to prevent cells other than a selected cell from being brought to a half-selected state, a configuration in which each of the memory cells MC is provided with a self-rectification function (see FIG. 3A) or a configuration in which a rectifier or a bidirectional rectifier is connected in series to a resistance change storage element (see FIGS. 3B and 3C) is generally adopted.

Figure 4A:
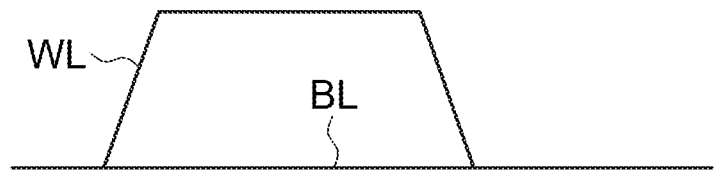
FIGS. 4A and 4B are diagrams illustrating write operations into a memory cell.
Figure 4B:
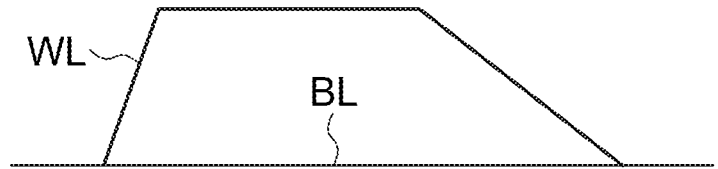

FIGS. 4A and 4B are diagrams illustrating write operations into a memory cell MC. A write operation to a high-resistance state (a reset state) is performed by an operation (a rapid cooling operation) of applying a higher voltage than that at the time of a set operation to a storage element and subsequently rapidly decreasing the voltage as illustrated in FIG. 4A. A write operation to a low-resistance state (a set state) is performed by an operation (a slow cooling operation) of applying a lower voltage than that at the time of the reset operation to a storage element and subsequently slowly decreasing the voltage as illustrated in FIG. 4B.

Figure 5:
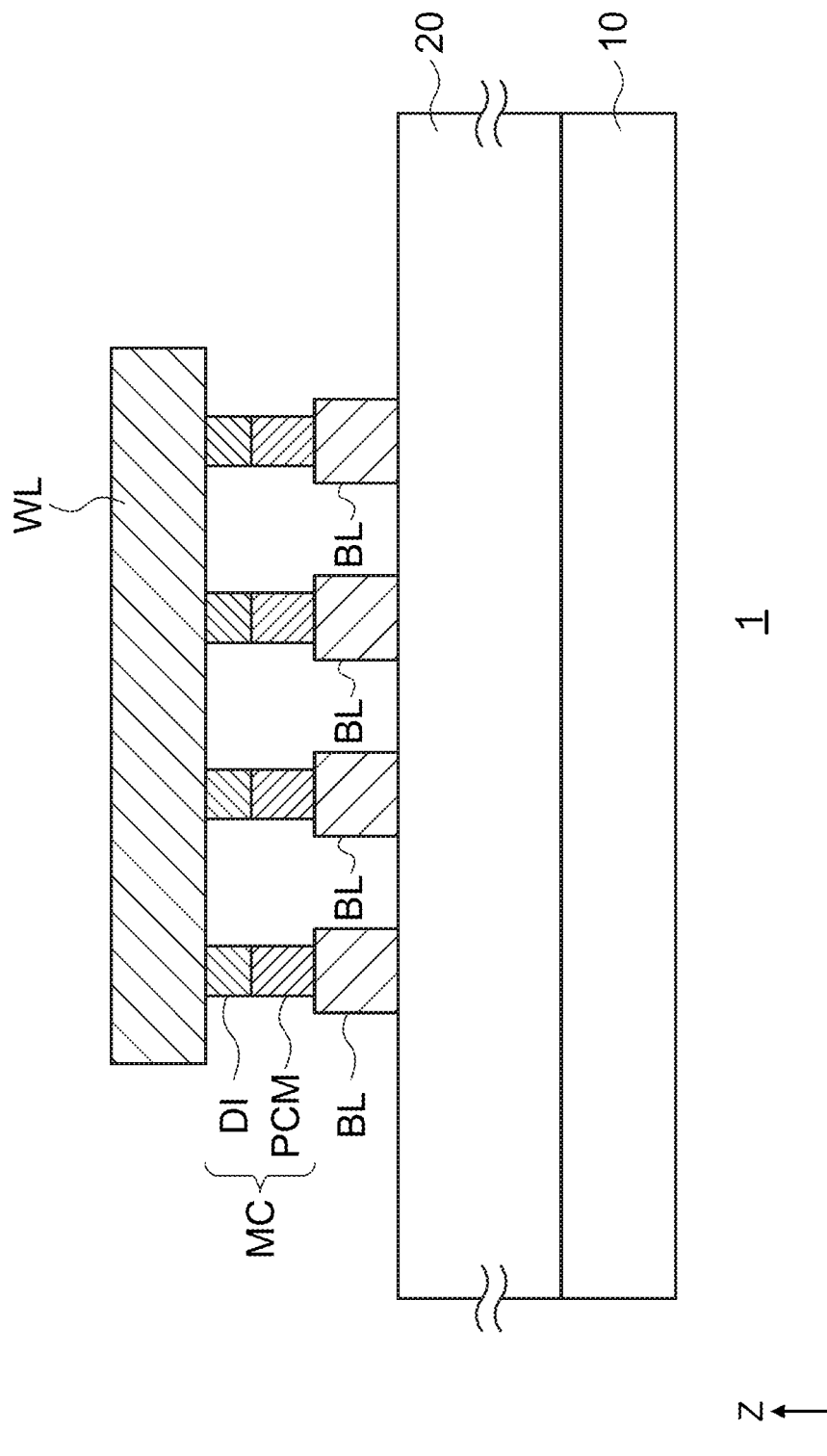
FIG. 5 is a diagram illustrating a part of a schematic cross section of the semiconductor storage device along a word line.

FIG. 5 is a diagram illustrating a part of a schematic cross section of the semiconductor storage device 1 along a word line WL. A semiconductor substrate 10 is, for example, a silicon substrate. Semiconductor elements (for example, a CMOS (Complementary Metal Oxide Semiconductor) circuit) (not illustrated) are provided on the semiconductor substrate 10. The word line driver WLD and a bit line driver BLD, which will be described later, may be configured of CMOS circuits on the semiconductor substrate 10. An interlayer dielectric film 20 covering the semiconductor elements is further provided on the semiconductor substrate 10.

The semiconductor storage device 1 according to the present embodiment is provided on the interlayer dielectric film 20. The semiconductor storage device 1 includes the memory cells MC provided to correspond to the intersection regions between the word lines WL extending in the X direction and the bit lines BL extending in the Y direction, respectively, as described above. Each of the memory cells MC includes a phase change memory element PCM and a diode DI. The memory element PCM and the diode DI are connected in series between a certain word line WL and a certain bit line BL. An equivalent circuit of the memory cell MC is the circuit illustrated in FIG. 3C.

The memory element PCM can be a phase change memory that performs setting and resetting with heat (a phase change memory based on a material including germanium (Ge), antimony (Sb), and tellurium (Te)). The memory element PCM may be a phase change memory based on a superlattice including Ge, Sb, and Te. The diode DI may be a MIM (Metal/Insulator/Metal) rectifier element, a rectifier element based on SiTe or GeTe, or the like.

In the present embodiment, the bit lines BL are arrayed substantially in parallel to the surface of the semiconductor substrate 10 and are provided below the word lines WL. The word lines WL are also arrayed substantially in parallel to the surface of the semiconductor substrate 10 and are provided above the bit lines BL. The bit lines BL are provided only on one side (a lower side) of the word lines WL without being provided on both sides of the word lines WL. The upper-lower relation between the bit lines BL and the word lines WL may be inverse. Therefore, the bit lines BL may be provided above the word lines WL.

In the present embodiment, the memory cells MC are provided between the word lines WL and the bit lines BL and are arranged in a matrix in two dimensions within the surface of the semiconductor substrate 10. However, the memory cells MC may be sterically arranged in three dimensions.

The word line driver WLD in FIG. 1 includes transistors Tr1_1 to Tr1_3 and Tr2_1 to Tr2_3. The transistors Tr1_1 to Tr1_3 serving as first switching elements are arranged on the side of first ends $E_{WL1}$ of the word lines WL and are connected to the first ends $E_{WL1}$, respectively. The transistors Tr1_1 to Tr1_3 transmit a selection voltage for writing data to memory cells from the first ends $E_{WL1}$. Other switching elements are not connected to second ends $E_{WL2}$ of the word lines WL respectively connected to the transistors Tr1_1 to Tr1_3. While, for example, p-type transistors are used as the transistors Tr1_1 to Tr1_3, the transistors are not limited thereto and may be n-type transistors. The number of the transistors Tr1_1 to Tr1_3 is not limited to three and may be four or more. The transistors Tr1_1 to Tr1_3 constitute a part of the word line driver WLD that applies the selection voltage to word lines WL.

The transistors Tr2_1 to Tr2_3 serving as second switching elements are arranged on the side of the second ends $E_{WL2}$ of the word lines WL and are connected to the second ends $E_{WL2}$, respectively. The transistors Tr2_1 to Tr2_3 transmit a selection voltage for writing data to memory cells from the second ends $E_{WL2}$. Other switching elements are not connected to the first ends $E_{WL1}$ of word lines WL respectively connected to the transistors Tr2_1 to Tr2_3. While, for example, p-type transistors are used as the transistors Tr2_1 to Tr2_3, the transistors are not limited thereto and may be n-type transistors. The number of the transistors Tr2_1 to Tr2_3 is not limited to three and may be four or more. The transistors Tr2_1 to Tr2_3 constitute a part of the word line driver WLD that applies the selection voltage to word lines WL.

The word line driver WLD includes the transistors Tr1_1 to Tr1_3 and Tr2_1 to Tr2_3 and generates the selection voltage as a data write voltage via the transistors Tr1_1 to Tr1_3 and Tr2_1 to Tr2_3.

In this way, the transistors Tr1_1 to Tr1_3 and the transistors Tr2_1 to Tr2_3 are alternately connected to different word lines WL, respectively, in the present embodiment.

Since being applied to memory cells MC via associated word lines WL, the selection voltage from the transistors Tr1_1 to Tr1_3 and the Tr2_1 to Tr2_3 decreases due to a voltage drop caused by the wiring resistance of the word lines WL. In this case, a sufficiently-high selection voltage is applied to memory cells MC relatively near the transistors Tr1_1 to Tr1_3 and Tr2_1 to Tr2_3. The memory cells MC are sufficiently heated and data can be written into the memory cells MC in this case. However, a sufficiently-high selection voltage cannot be applied to memory cells MC relatively far from the transistors Tr1_1 to Tr1_3 and Tr2_1 to Tr2_3. In this case, there is a risk that the memory cells MC are not sufficiently heated and data cannot be written thereto.

To solve this problem, in the present embodiment, the transistors Tr1_1 to Tr1_3 and Tr2_1 to Tr2_3 respectively connected to the word lines WL are arranged alternately and dispersedly at the first ends $E_{WL1}$ and the second ends $E_{WL2}$ of the word lines WL and the selection voltage is applied at the same time to a plurality of memory cells MC adjacent in the extending direction (the Y direction) of the bit lines BL. For example, the transistors Tr1_2 and Tr2_1 in FIG. 1 apply the selection voltage at the same time to a memory cell group GR1 including two memory cells MCa and MCb adjacent in the Y direction. The memory cells MCa and MCb in the memory cell group GR1 are arrayed in the Y direction and are connected to a same bit line BL. The memory cell group GR1 is a range of memory cells MC that are selected at the same time for data write or read. The memory cell group GR1 may be selected with shifts of one cell (one bit) in the extending direction (the X direction) of the word lines WL or the extending direction (the Y direction) of the bit lines BL, respectively.

Since the memory cell MCa is relatively near the transistor Tr2_1, a sufficiently large current can be passed therethrough. Meanwhile, since the memory cell MCb is relatively far from the transistor Tr1_2, a sufficiently large current cannot be passed therethrough. In this case, the memory cell MCa passes a large current and becomes a high temperature while the memory cell MCb passes only a small current and does not produce much heat. However, since the memory cells MCa and MCb are adjacent to each other, heat of the memory cell MCa at a high temperature is transmitted to the memory cell MCb at a low temperature and can heat the memory cell MCb. Since the memory cell MCb is heated with the heat from the memory cell MCa, data can be written into the memory cell MCb more reliably. In the present specification, "the same time" includes not only the literally same time but also a case in which timings are slightly different. Although a plurality of memory cells to which the selection voltage is applied at the same time are preferably "adjacent" to each other, it suffices that the memory cells are in a range where heat of one of the memory cells can be transmitted to the other. Therefore, the memory cells to which the selection voltage is applied at the same time may be located in the "proximity" or "vicinity" to each other.

As described above, the transistors Tr1_1 to Tr1_3 and Tr2_1 to Tr2_3 are connected alternately to the first and second ends $E_{WL1}$ and $E_{WL2}$ of the word lines WL, respectively, in the first embodiment. Accordingly, the word line driver WLD can drive the memory cell MCa near the transistor Tr2_1 and the memory cell MCb far from the transistor Tr1_2 at the same time and can efficiently heat the memory cell MCb with heat of the memory cell MCa. This enables data to be reliably written into the memory cell MCb as well as into the memory cell MCa.

Since the memory cells MCa and MCb are adjacent to each other according to the present embodiment, thermal energy produced by currents diffuses between each other. Therefore, energy consumption at the time of writing can be reduced by use of the thermal energy from one memory cell MCa in the other memory cell MCb.

Further, due to mutual use of the thermal energy by the adjacent memory cells MCa and MCb, the total of a set current and a reset current can be reduced. Accordingly, the currents flowing in the word lines WL and the bit lines BL can be reduced and a voltage drop of the selection voltage can also be reduced. As a result, the number of memory cells MC that can be connected to each of the word lines WL can be increased and the bit cost can be reduced.

While being a voltage at the time of data write in the embodiment described above, the selection voltage may be a voltage at the time of data read. In the above embodiment, the transistors Tr1_1 to Tr2_3 in the word line driver WLD have been explained focused on the word lines WL. However, transistors (not illustrated in FIG. 1) in a bit line driver may be configured in an identical manner focused on the bit lines BL.

Second Embodiment

Figure 6:
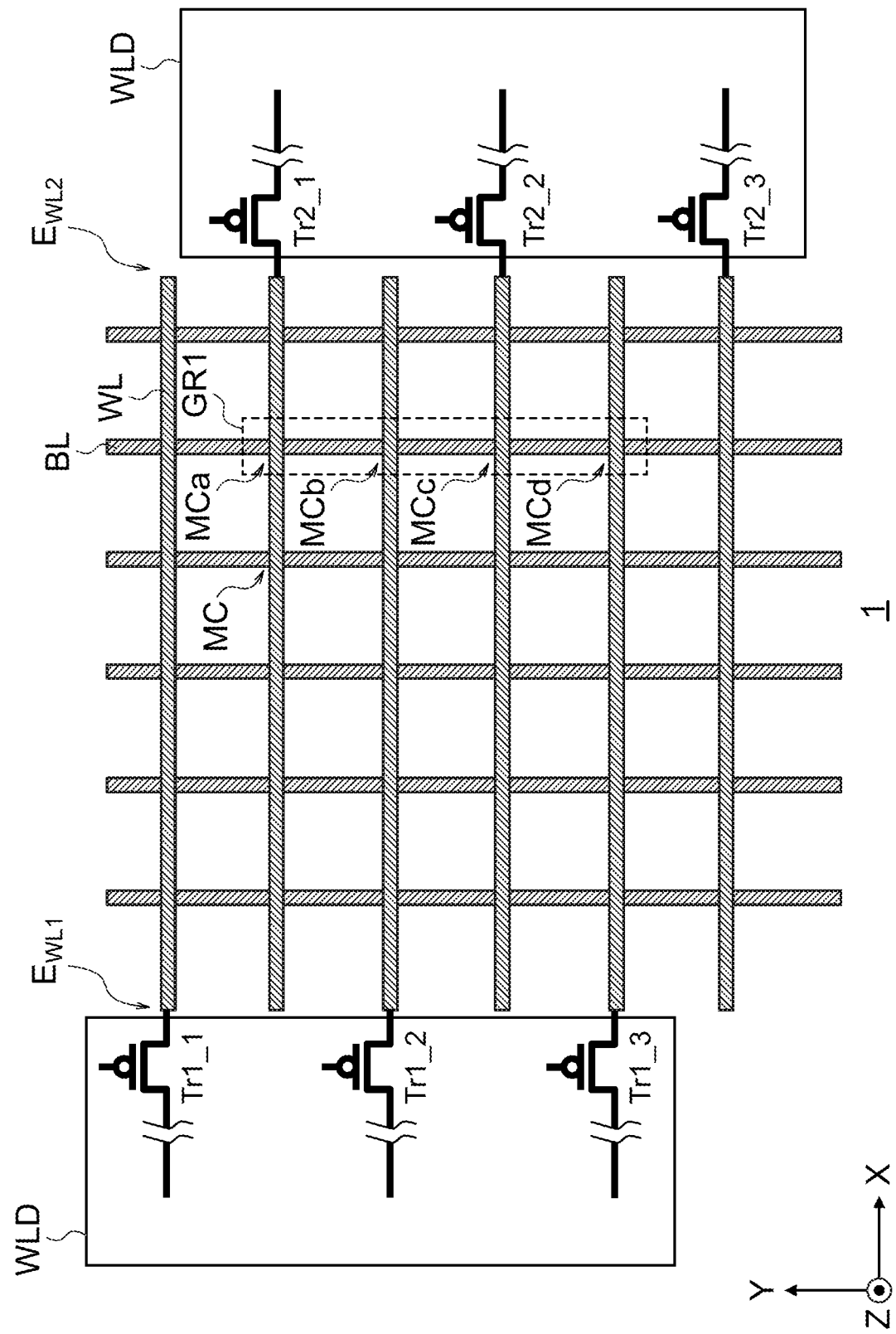
FIG. 6 is a plan view illustrating a configuration example of a semiconductor storage device according to a second embodiment.

FIG. 6 is a plan view illustrating a configuration example of the semiconductor storage device 1 according to a second embodiment. In the second embodiment, four memory cells MCa to MCd arrayed adjacently (successively) along a bit line BL are driven at the same time. The number of the transistors Tr1_2 and Tr1_3 on the side of the first ends $E_{WL1}$ and the number of the transistors Tr2_1 and Tr2_2 on the side of the second ends $E_{WL2}$, that apply the selection voltage to the memory cells MCa to MCd at the same time are respectively two and same. In this way, the numbers of transistors that apply the selection voltage at the same time are same on the sides of the first and second ends $E_{WL1}$ and $E_{WL2}$. Therefore, for example, the number of the memory cells MCa and MCc at a high temperature and the number of the memory cells MCb and MCd at a low temperature are same and the high-temperature memory cells and the low-temperature memory cells are alternately adjacent to each other. As a result, heat balance among the memory cells is established and the high-temperature memory cells can more efficiently heat the low-temperature memory cells. The memory cell group GR1 may be selected with shifts of one cell (one bit) in the extending direction (the X direction) of the word lines WL or the extending direction (the Y direction) of the bit lines BL, respectively.

The number of memory cells to which the selection voltage is applied at the same time may be increased. It is preferable that the number of memory cells to which the selection voltage is applied at the same time be an even number in consideration of heat balance among the memory cells. However, the number of memory cells to which the selection voltage is applied at the same time may be an odd number. While heat balance is not established in this case, high-temperature memory cells can heat low-temperature memory cells. That is, the number of high-temperature memory cells and the number of low-temperature memory cells may be slightly different from each other.

Other configurations and operations of the semiconductor storage device 1 according to the second embodiment may be identical to those of the first embodiment. Accordingly, the second embodiment can obtain identical effects as those of the first embodiment.

Third Embodiment

Figure 7:
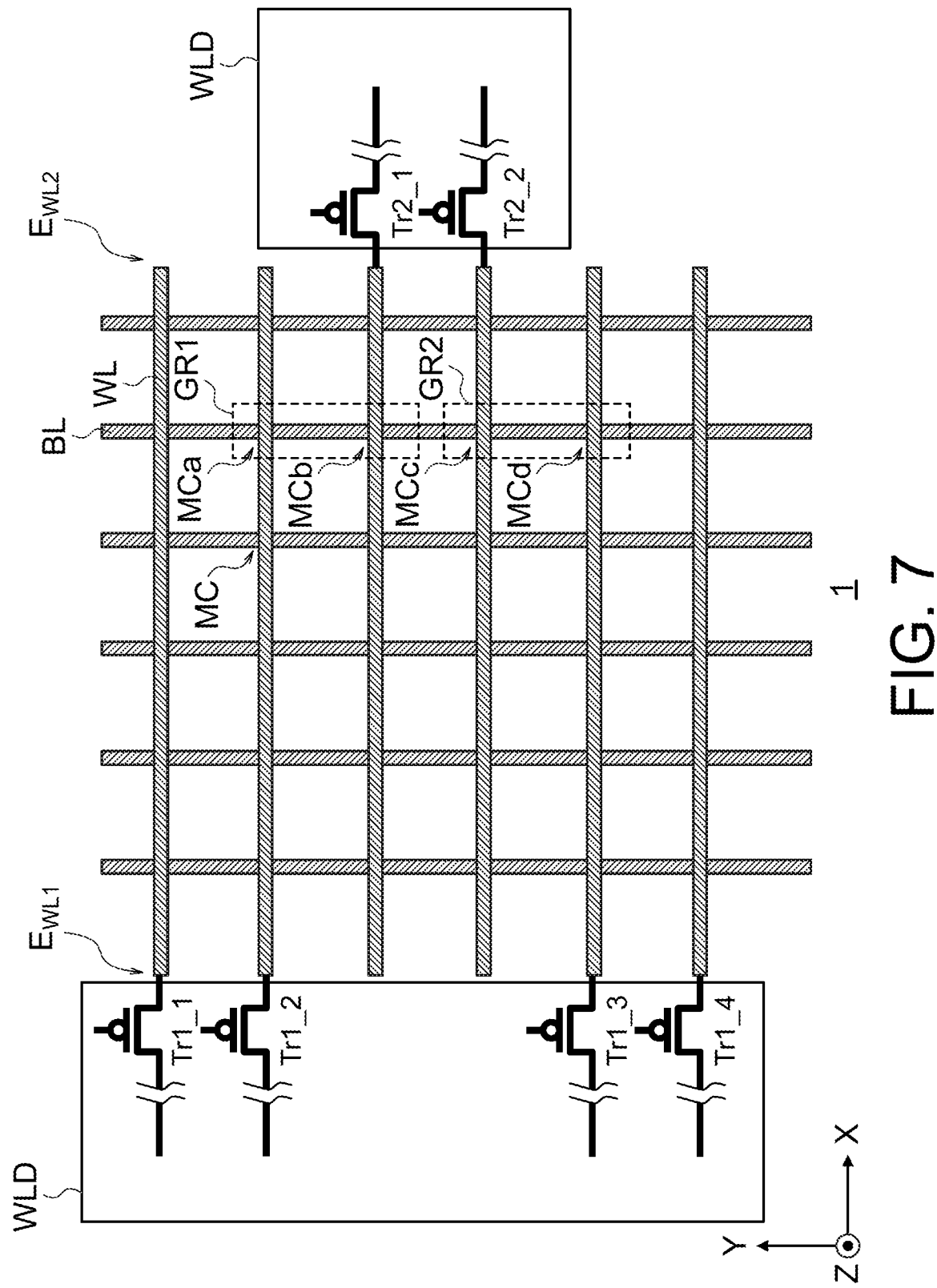
FIG. 7 is a plan view illustrating a configuration example of a semiconductor storage device according to a third embodiment.

FIG. 7 is a plan view illustrating a configuration example of the semiconductor storage device 1 according to a third embodiment. In the third embodiment, transistors Tr1_1 to Tr1_4 respectively connected to the first ends $E_{WL1}$ of word lines WL and transistors Tr2_1 and Tr2_2 respectively connected to the second ends $E_{WL2}$ are arranged alternately by twos with respect to the word lines WL. To generalize, transistors respectively connected to the first ends $E_{WL1}$ of word lines WL and transistors respectively connected to the second ends $E_{WL2}$ are arranged alternately by m (m is an integer equal to or more than 2) elements with respect to the word lines WL.

In this case, memory cells MCa to MCd driven at the same time are memory cells MC corresponding to word lines WL to which the transistors Tr1_2 and Tr1_3 are connected at the first ends $E_{WL1}$ and memory cells MC corresponding to word lines WL to which the transistor Tr2_1 and Tr2_2 are connected at the second ends $E_{WL2}$. Furthermore, these memory cells MCa to MCd are adjacent along one bit line BL. For example, the memory cells MCa and MCb in FIG. 7 are connected to two word lines WL to which the transistors Tr1_2 and Tr2_1 are connected at the first and second ends $E_{WL1}$ and $E_{WL2}$, respectively. Further, the memory cells MCa and MCb are adjacent along a bit line BL. The selection voltage is applied to a memory cell group GR1 including these memory cells MCa and MCb. Similarly, the selection voltage is applied to a memory cell group GR2 in a different period from that of the selection of the memory cell group GR1. The memory cell groups GR1 and GR2 may be selected with shifts of one cell (one bit) in the extending direction (the X direction) of the word lines WL, respectively. Alternatively, the memory cell groups GR1 and GR2 may be selected with shifts of two cells (two bits) or four cells (four bits) in the extending direction (the Y direction) of the bit lines BL, respectively.

Other configurations and operations of the semiconductor storage device 1 according to the third embodiment may be identical to those of the first embodiment. Accordingly, the third embodiment can obtain identical effects as those of the first embodiment.

Fourth Embodiment

Figure 8:
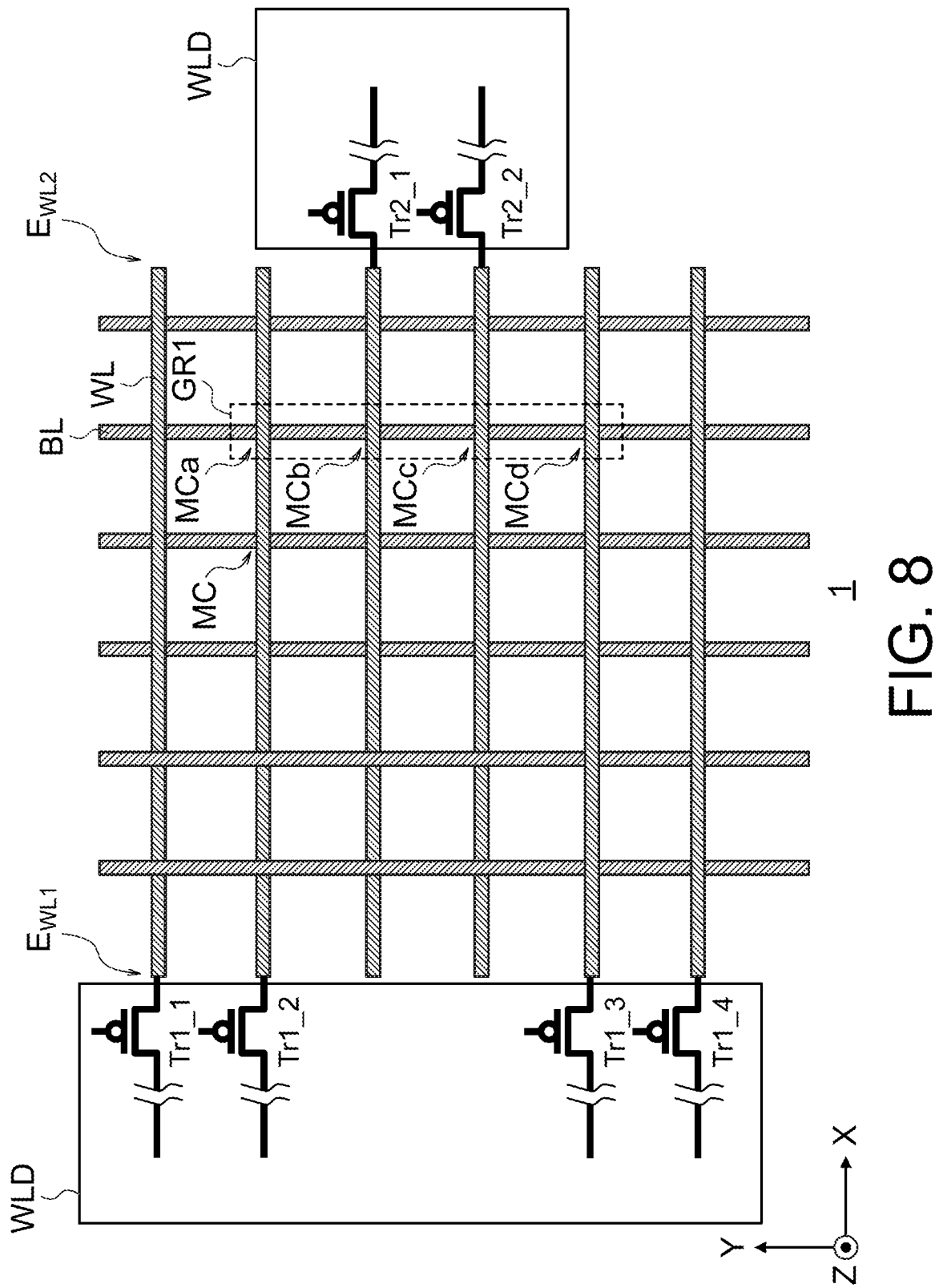
FIG. 8 is a plan view illustrating a configuration example of a semiconductor storage device according to a fourth embodiment.

FIG. 8 is a plan view illustrating a configuration example of the semiconductor storage device 1 according to a fourth embodiment. The fourth embodiment is an embodiment in which the second embodiment is combined with the third embodiment. That is, four memory cells MCa to MCd arrayed adjacently (successively) along a bit line BL are driven at the same time in the fourth embodiment. The number of the transistors Tr1_2 and Tr1_3 on the side of the first ends $E_{WL1}$ and the number of the transistors Tr2_1 and Tr2_2 on the side of the second ends $E_{WL2}$, that apply the selection voltage to the memory cells MCa to MCd at the same time are respectively two and same. In this way, the numbers of transistors that apply the selection voltage at the same time are same on the sides of the first and second ends $E_{WL1}$ and $E_{WL2}$. Accordingly, for example, the number of high-temperature memory cells MCb and MCc and the number of low-temperature memory cells MCa and MCd are same and the high-temperature memory cells are adjacent to the low-temperature memory cells. As a result, heat balance among the memory cells is established and the high-temperature memory cells can more efficiently heat the low-temperature memory cells.

Also in the fourth embodiment, the number of memory cells to which the selection voltage is applied at the same time may be increased. In consideration of heat balance among the memory cells, the number of memory cells to which the selection voltage is applied at the same time is preferably an even number. However, the number of memory cells to which the selection voltage is applied at the same time may be an odd number. While heat balance is not established in this case, high-temperature memory cells can heat low-temperature memory cells. The memory cell group GR1 may be selected with shifts of one cell (one bit) in the extending direction (the X direction) of the word lines WL, respectively. The memory cell group GR1 may alternatively be selected with shifts of one cell (one bit), two cells (two bits), or four cells (four bits) in the extending direction (the Y direction) of the bit lines BL, respectively.

Other configurations and operations of the semiconductor storage device 1 according to the fourth embodiment may be identical to those of the third embodiment. Accordingly, the fourth embodiment can obtain identical effects as those of the third embodiment.

Fifth Embodiment

Figure 9:
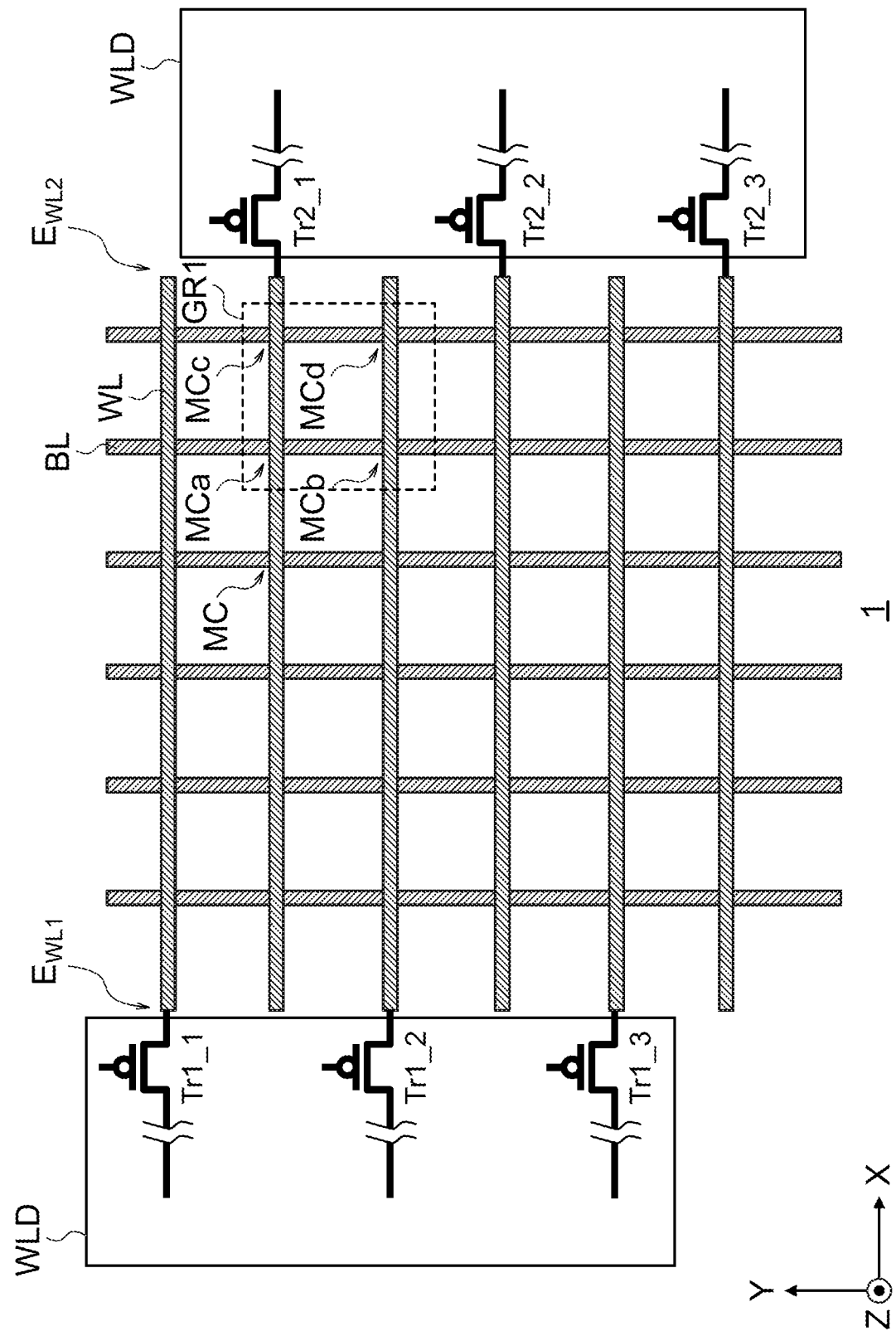
FIG. 9 is a plan view illustrating a configuration example of a semiconductor storage device according to a fifth embodiment.

FIG. 9 is a plan view illustrating a configuration example of the semiconductor storage device 1 according to a fifth embodiment. In the first embodiment, a plurality of memory cells MC arranged adjacently or successively along one bit line BL are driven at the same time. In contrast thereto, four memory cells MCa to MCd arrayed adjacently or successively along two adjacent bit lines BL are driven at the same time in the fifth embodiment.

The number of the transistor Tr1_2 on the side of the first ends $E_{WL1}$ and the number of the transistor Tr2_1 on the side of the second ends $E_{WL2}$, that apply the selection voltage to the memory cells MCa to MCd at the same time are respectively one and same. Accordingly, for example, the high-temperature memory cells MCa and MCc and the low-temperature memory cells MCb and MCd arrayed along a plurality of bit lines BL are same in the number and are adjacent to each other. As a result, heat balance among the memory cells is established and the high-temperature memory cells can more efficiently heat the low-temperature memory cells. The number of bit lines BL selected at the same time is not particularly limited and may be three or more. However, to substantially equalize the temperatures of the memory cells, it is preferable that the number of high-temperature memory cells near transistors of the word line driver WLD and the number of low-temperature memory cells far from transistors of the word line driver WLD be approximately the same. The memory cell group GR1 may be selected with shifts of one cell (one bit) in the extending direction (the X direction) of the word lines WL or the extending direction (the Y direction) of the bit lines BL, respectively.

Other configurations and operations of the semiconductor storage device 1 according to the fifth embodiment may be identical to those of the first embodiment. Accordingly, the fifth embodiment can obtain identical effects as those of the first embodiment.

Sixth Embodiment

Figure 10:
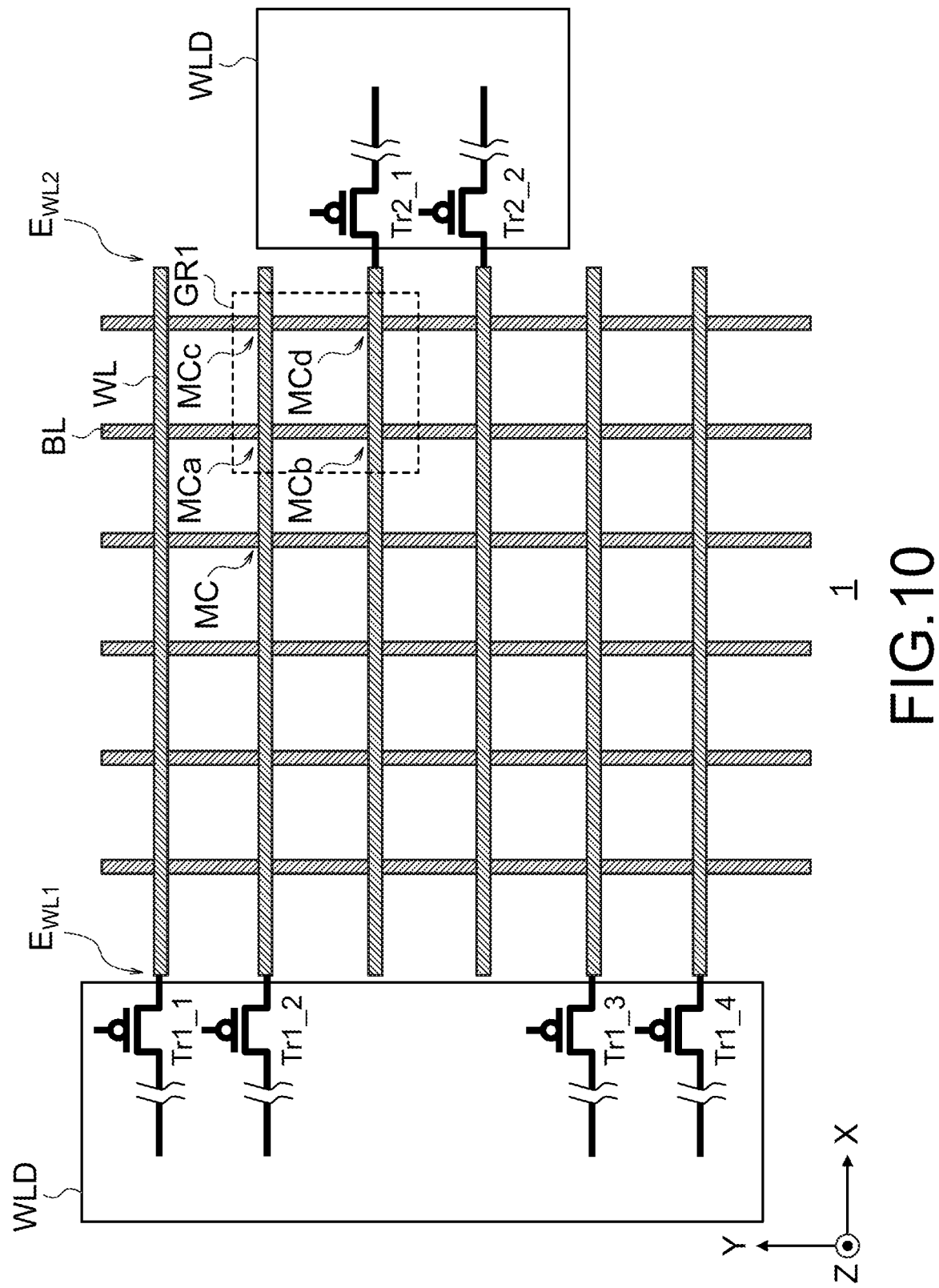
FIG. 10 is a plan view illustrating a configuration example of a semiconductor storage device according to a sixth embodiment.

FIG. 10 is a plan view illustrating a configuration example of the semiconductor storage device 1 according to a sixth embodiment. In the sixth embodiment, transistors Tr1_1 to Tr1_4 respectively connected to the first ends $E_{WL1}$ of the word lines WL and transistors Tr2_1 and Tr2_2 respectively connected to the second ends $E_{WL2}$ are arranged alternately by twos with respect to the word lines WL.

In this case, memory cells MCa and MCc driven at the same time correspond to a word line WL to which the transistor Tr1_2 is connected at the first end $E_{WL1}$ and the memory cells MCb and MCd correspond to a word line WL to which the transistor Tr2_1 is connected at the second end $E_{WL2}$. Furthermore, these memory cells MCa to MCd are adjacent along two adjacent bit lines BL. For example, the memory cells MCa and MCc in FIG. 10 are connected to one word line WL to which the transistor Tr1_2 is connected at the first end $E_{WL1}$. Further, the memory cells MCa and MCc are connected to two bit lines BL adjacent in the X direction, respectively. The memory cells MCb and MCd are connected to one word line WL to which the transistor Tr2_1 is connected at the second end $E_{WL2}$. Further, the memory cells MCb and MCd are connected to the two bit lines BL adjacent in the X direction, respectively. In this way, the selection voltage is applied to the memory cell group GR1 including the memory cells MCa to MCd at the same time. The number of bit lines BL selected at the same time is not particularly limited and may be three or more. However, to substantially equalize the temperatures of the memory cells, it is preferable that the number of high-temperature memory cells near transistors of the word line driver WLD and the number of low-temperature memory cells far from transistors of the word line driver WLD be approximately the same. The memory cell group GR1 may be selected with shifts of one cell (one bit) in the extending direction (the X direction) of the word lines WL, respectively. Alternatively, the memory cell group GR1 may be selected with shifts of two cells (two bits) in the extending direction (the Y direction) of the bit lines BL, respectively.

Other configurations and operations of the semiconductor storage device 1 according to the sixth embodiment may be identical to those of the third embodiment. Accordingly, the sixth embodiment can obtain identical effects as those of the third embodiment.

Seventh Embodiment

Figure 11:
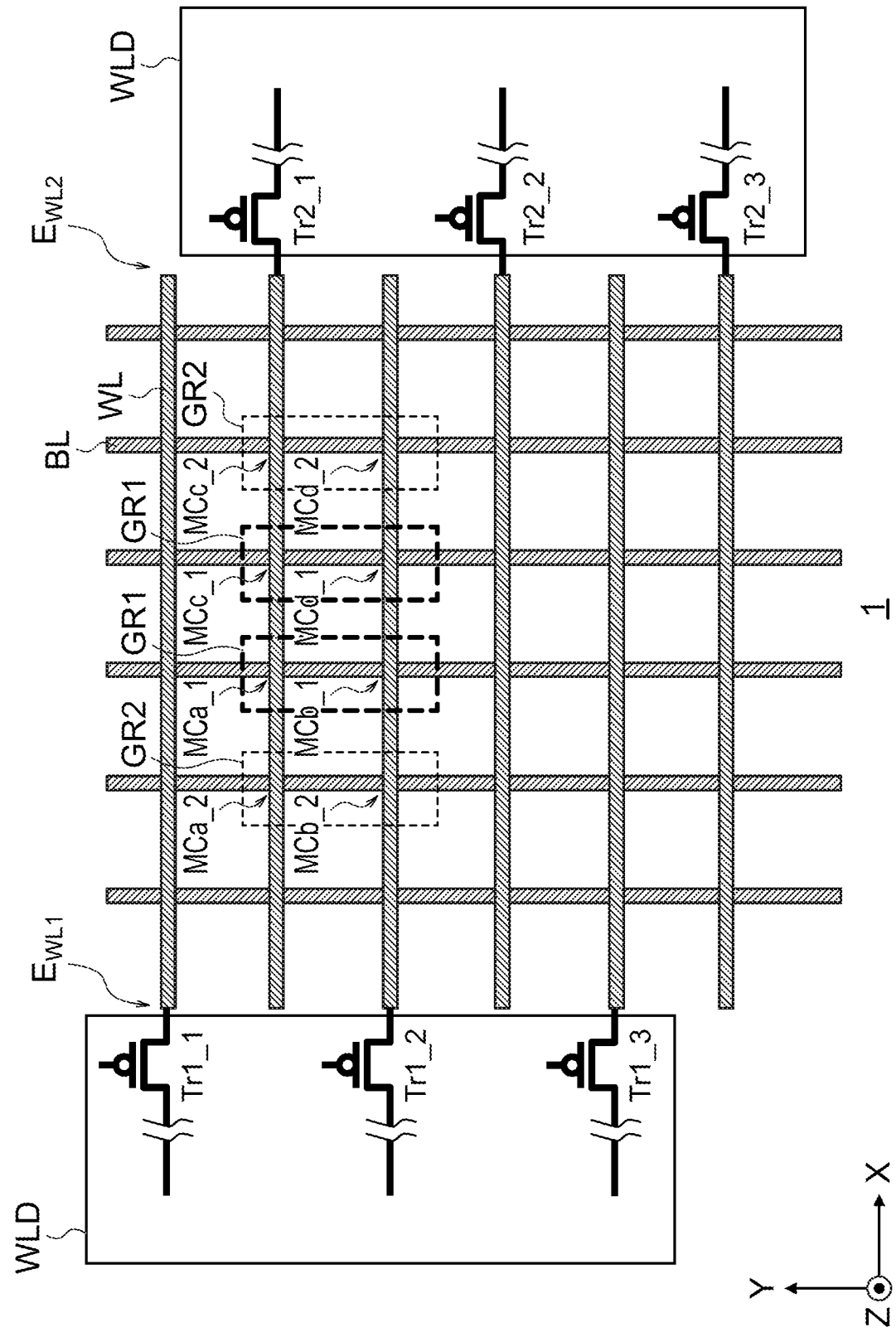
FIG. 11 is a plan view illustrating a configuration example of a semiconductor storage device according to a seventh embodiment.

FIG. 11 is a plan view illustrating a configuration example of the semiconductor storage device 1 according to a seventh embodiment. The seventh embodiment is same as the fifth embodiment in that four memory cells MCa to MCd arrayed adjacently along two bit lines BL are driven at the same time. However, the two bit lines BL selected at the same time do not always need to be adjacent to each other and are selected in such a manner that the gravity centers of memory cells MC selected at the same time are substantially constant at the location in the X direction in the seventh embodiment. The memory cell groups GR1 and GR2 may be selected with shifts of one cell (one bit) in the extending direction (the Y direction) of the bit lines BL, respectively. Alternatively, the memory cell groups GR1 and GR2 may be selected with shifts of one cell (one bit) in directions away from each other in the extending direction (the X direction) of the word lines WL, respectively.

For example, memory cells MCa_1 to MCd_1 in the memory cell group GR1 in FIG. 11 are selected at the same time. In this case, two adjacent bit lines BL are selected, so that the temperatures of the memory cells MCa_1 and MCb_1 are substantially equalized and the temperatures of the memory cells MCc_1 and MCd_1 are substantially equalized. On the other hand, memory cells MCa_2 to MCd_2 in the memory cell group GR2 are selected at the same time in a different selection period from that of the memory cell group GR1. In this case, two selected bit lines BL are not adjacent and other bit lines BL are located therebetween. Also in this case, the temperatures of the memory cells MCa_2 and MCb_2 are substantially equalized and the temperatures of the memory cells MCc_2 and MCd_2 are substantially equalized. The gravity centers of the memory cell groups GR1 and GR2 are substantially coincident with each other. As described above, two bit lines BL selected at the same time do not always need to be adjacent to each other.

Other configurations and operations of the semiconductor storage device 1 according to the seventh embodiment may be identical to those of the fifth embodiment. Accordingly, the seventh embodiment can obtain identical effects as those of the fifth embodiment.

Eighth Embodiment

Figure 12:
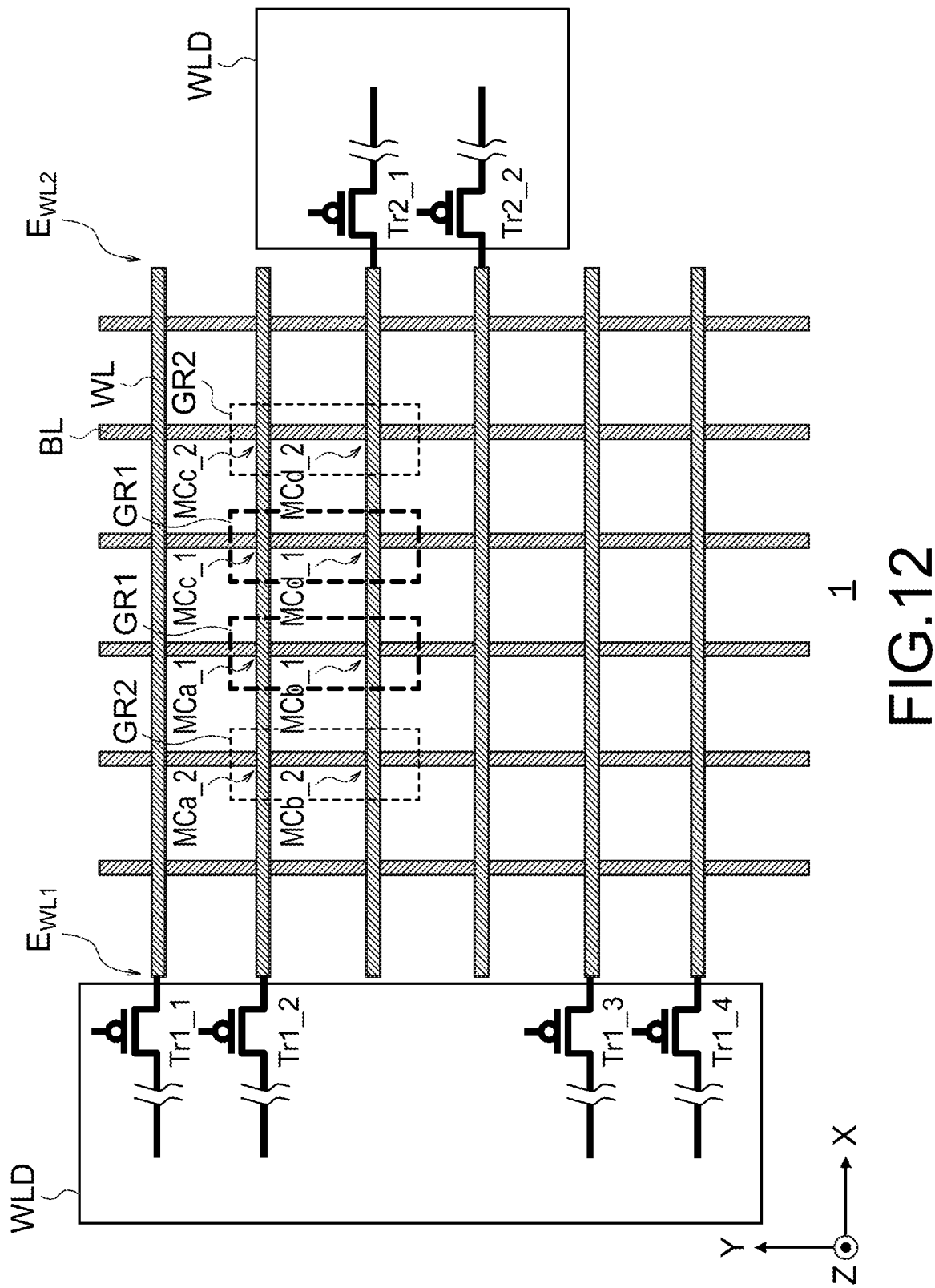
FIG. 12 is a plan view illustrating a configuration example of a semiconductor storage device according to an eighth embodiment.

FIG. 12 is a plan view illustrating a configuration example of the semiconductor storage device 1 according to an eighth embodiment. In the eighth embodiment, transistors Tr1_1 to Tr1_4 respectively connected to the first ends $E_{WL1}$ of the word lines WL and transistors Tr2_1 and Tr2_2 respectively connected to the second ends $E_{WL2}$ are arranged alternately by twos with respect to the word lines WL. That is, the eight embodiment is an embodiment in which the sixth embodiment is combined with the seventh embodiment.

In this case, a plurality of memory cells MCa to MCd driven at the same time correspond to a plurality of word lines WL to which the transistors Tr1_2 and Tr2_1 are connected at the first and second ends $E_{WL1}$ and $E_{WL2}$, respectively. Furthermore, these memory cells MCa to MCd are connected to two bit lines BL adjacent in the X direction. However, the two bit lines BL selected at the same time do not always need to be adjacent and are selected in such a manner that the gravity centers of memory cells MC selected at the same time are substantially constant in the eighth embodiment. The memory cell groups GR1 and GR2 may be selected with shifts of two cells (two bits) in the extending direction (the Y direction) of the bit lines BL, respectively. The memory cell groups GR1 and GR2 may be selected with shifts of one cell (one bit) in directions away from each other in the extending direction (the Y direction) of the bit lines BL, respectively.

For example, the memory cells MCa_1 to MCd_1 in the memory cell group GR1 in FIG. 12 are selected at the same time. In this case, two adjacent bit lines BL are selected, so that the temperatures of the memory cells MCa_1 and MCb_1 are substantially equalized and the temperatures of the memory cells MCc_1 and MCd_1 are substantially equalized. On the other hand, the memory cells MCa_2 to MCd_2 in the memory cell groups GR2 are selected at the same time in a different selection period from that of the memory cell group GR1. In this case, two selected bit lines BL are not adjacent and other bit lines BL are located therebetween. Also in this case, the temperatures of the memory cells MCa_2 and MCb_2 are substantially equalized and the temperatures of the memory cells MCc_2 and MCd_2 are substantially equalized. The gravity centers of the memory cell groups GR1 and GR2 are substantially coincident with each other. As described above, two bit lines BL selected at the same time do not always need to be adjacent to each other.

Other configurations and operations of the semiconductor storage device 1 according to the eighth embodiment may be identical to those of the sixth embodiment. Accordingly, the eighth embodiment can obtain identical effects as those of the sixth embodiment.

Ninth Embodiment

Figure 13:
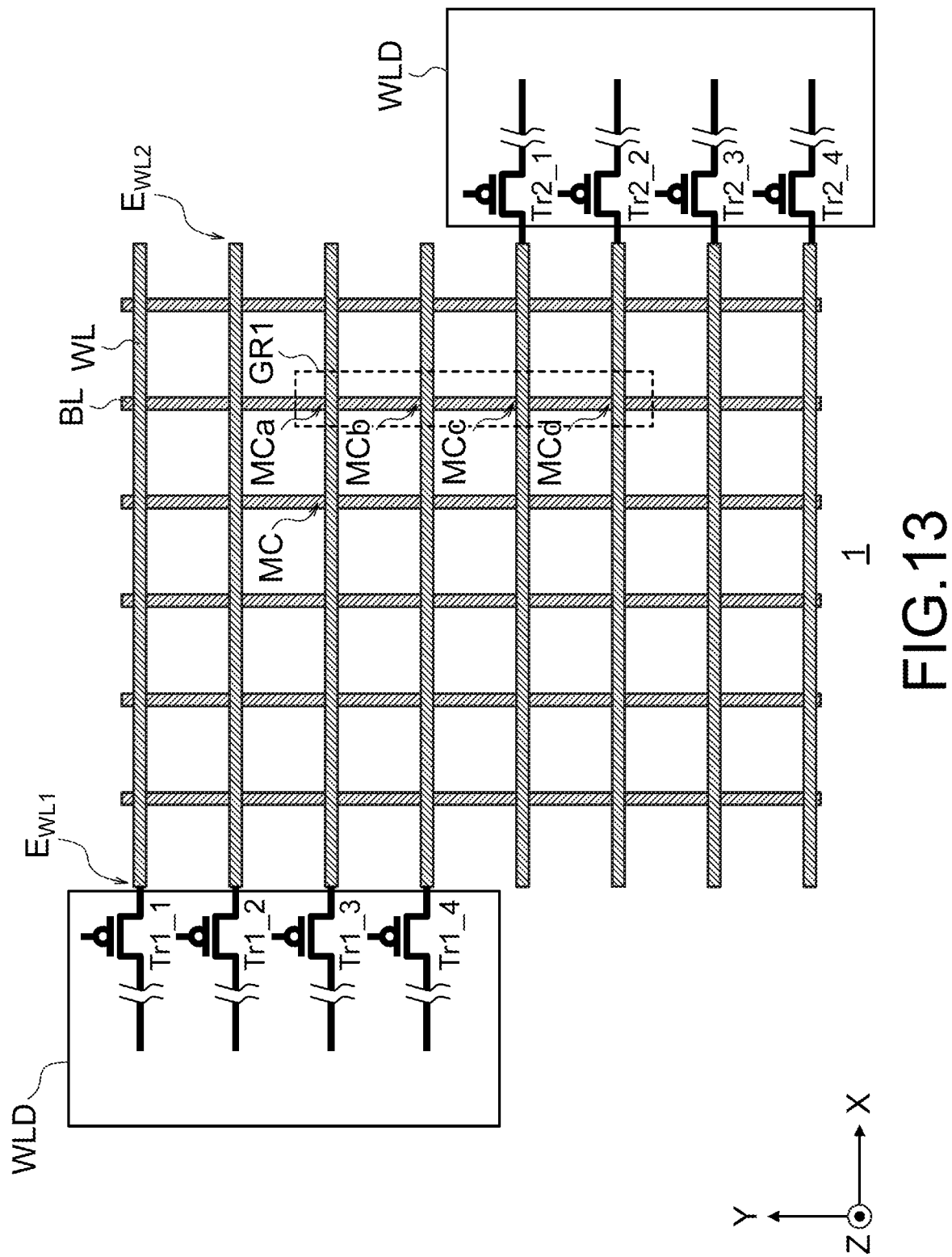
FIG. 13 is a plan view illustrating a configuration example of a semiconductor storage device according to a ninth embodiment.

FIG. 13 is a plan view illustrating a configuration example of the semiconductor storage device 1 according to a ninth embodiment. In the ninth embodiment, transistors Tr1_1 to Tr1_4 respectively connected to the first ends $E_{WL1}$ of the word lines WL and transistors Tr2_1 to Tr2_4 respectively connected to the second ends $E_{WL2}$ are arranged alternately by fours (by halves in a staggered manner) with respect to the word lines WL.

In the ninth embodiment, four memory cells MCa to MCd arrayed adjacently (successively) along a bit line BL are driven at the same time. The number of the transistors Tr1_3 and Tr1_4 on the side of the first ends $E_{WL1}$ and the number of the transistors Tr2_1 and Tr2_2 on the side of the second ends $E_{WL2}$, that apply the selection voltage to the memory cells MCa to MCd at the same time are respectively two and same. In this way, the numbers of transistors that apply the selection voltage at the same time are same on the sides of the first and second ends $E_{WL1}$ and $E_{WL2}$. Accordingly, for example, the number of high-temperature memory cells MCc and MCd and the number of low-temperature memory cells MCa and MCb are same and the high-temperature memory cells and the low-temperature memory cells are adjacent. As a result, heat balance among the memory cells is established and the high-temperature memory cells can more efficiently heat the low-temperature memory cells. The memory cell group GR1 may be selected with shifts of one cell (one bit) in the extending direction (the X direction) of the word lines WL, respectively. Alternatively, the memory cell group GR1 may be selected with shifts of four cells (four bits) in the extending direction (the Y direction) of the bit lines BL, respectively.

Figure 14:
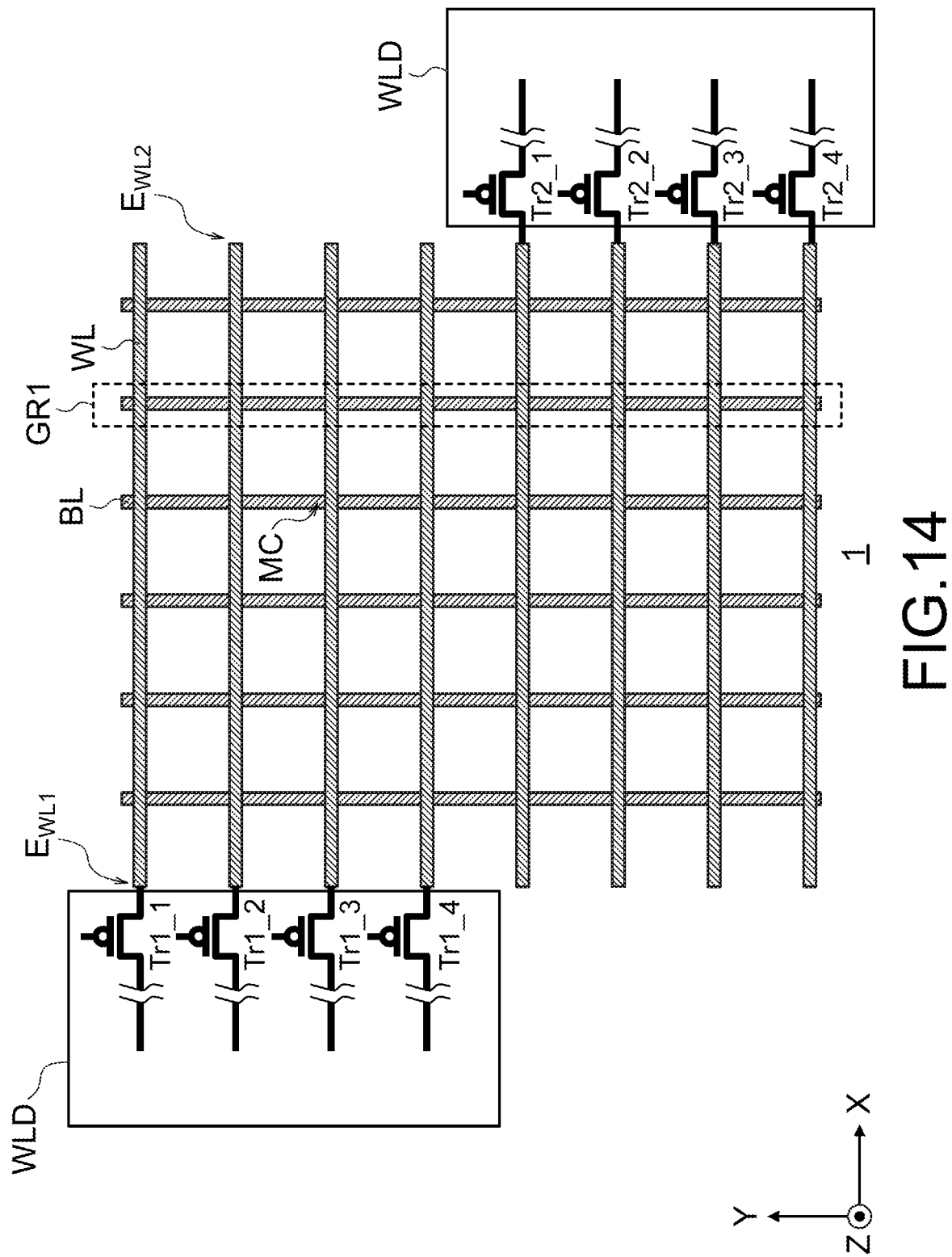
FIG. 14 is a plan view illustrating a configuration example of a semiconductor storage device according to a modification of the ninth embodiment.

Also in the ninth embodiment, the number of memory cells to which the selection voltage is applied at the same time may be increased. In consideration of heat balance among the memory cells, the number of memory cells to which the selection voltage is applied at the same time is preferably an even number. For example, FIG. 14 is a plan view illustrating a configuration example of the semiconductor storage device 1 according to a modification of the ninth embodiment. In this modification, the number of memory cells to which the selection voltage is applied at the same time is eight. Also in this modification, the number of the transistors Tr1_1 to Tr1_4 on the side of the first ends $E_{WL1}$ and the number of the transistors Tr2_1 to Tr2_4 on the side of the second ends $E_{WL2}$, that apply the selection voltage to the memory cells MC at the same time are respectively four and same.

The number of memory cells to which the selection voltage is applied at the same time may be an odd number. While heat balance is not established in this case, high-temperature memory cells can heat low-temperature memory cells. In FIG. 14, the memory cell group GR1 may be selected with shifts of one cell (one bit) in the extending direction (the X direction) of the word lines WL, respectively. Alternatively, the memory cell group GR1 may be selected with shifts of four cells (four bits) or eight cells (eight bits) in the extending direction (the Y direction) of the bit lines BL, respectively.

Other configurations and operations of the semiconductor storage device 1 according to the ninth embodiment may be identical to those of the fourth embodiment. Accordingly, the ninth embodiment can obtain identical effects as those of the fourth embodiment.

In the above embodiment, the transistors Tr1_1, Tr1_2 . . . arranged on the side of the first ends $E_{WL1}$ of the word lines WL and the transistors Tr2_1, Tr2_2 . . . arranged on the side of the second ends $E_{WL2}$ are arranged alternately by m elements with respect to the word lines WL. The value m is not particularly limited and can be any number.

Tenth Embodiment

Figure 15:
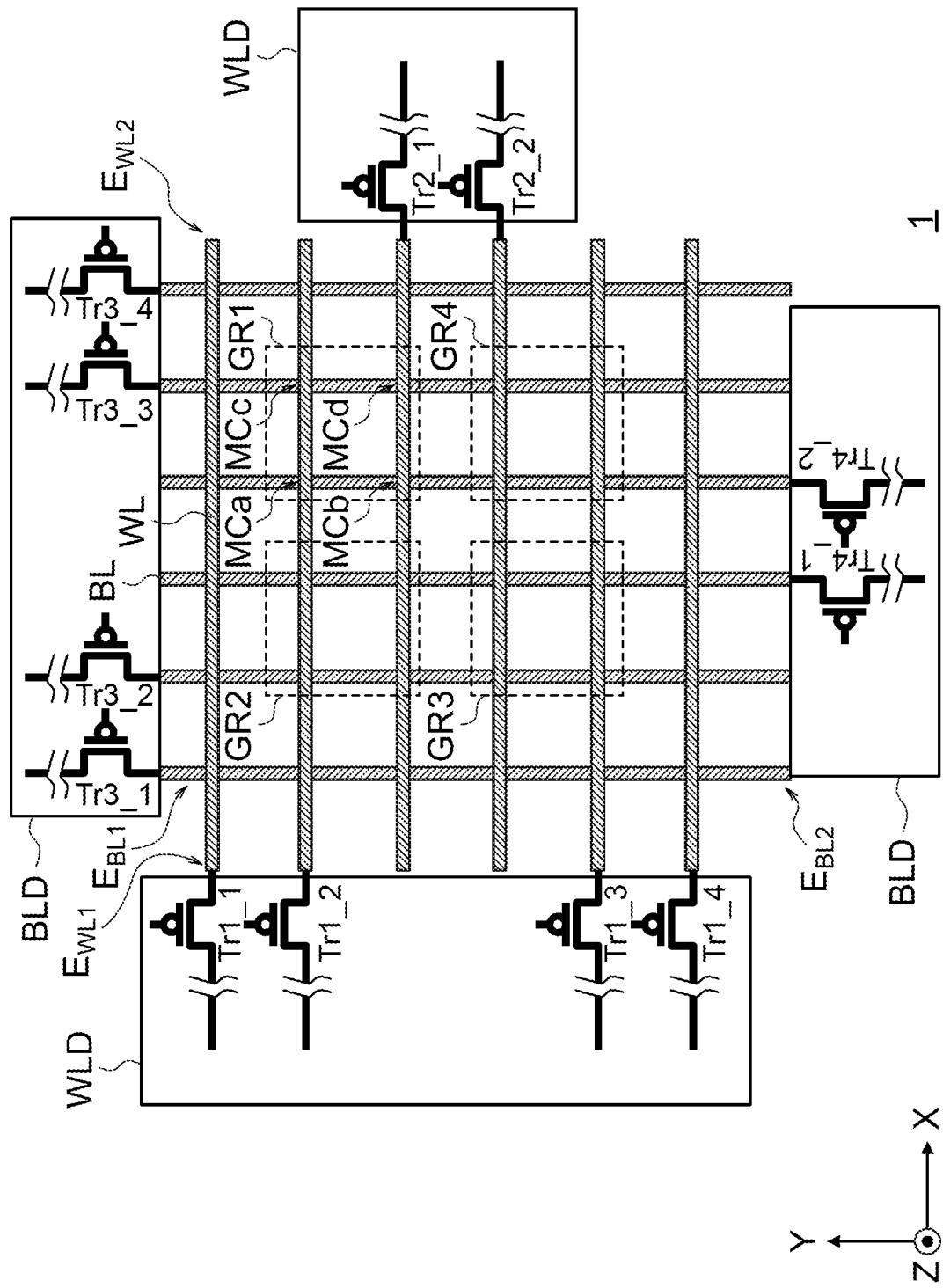
FIG. 15 is a plan view illustrating a configuration example of a semiconductor storage device according to a tenth embodiment.

FIG. 15 is a plan view illustrating a configuration example of the semiconductor storage device 1 according to a tenth embodiment. In the tenth embodiment, the bit line driver BLD includes transistors Tr3_1 to Tr3_4 respectively connected to third ends $E_{BL1}$ of the bit lines BL, and transistors Tr4_1 and Tr4_2 respectively connected to fourth ends $E_{BL2}$ thereof. The transistors Tr3_1 to Tr3_4 and the transistors Tr4_1 and Tr4_2 are arranged alternately by twos with respect to the bit lines BL. That is, the transistors Tr3_1 to Tr3_4 serving as fourth switching elements are arranged on the side of the third ends $E_{BL1}$ of the bit lines BL and transmit a selection voltage for writing or reading data to memory cells MC. For example, when the selection voltage (a first selection voltage) applied to word lines WL is a high-level voltage, the selection voltage (a second selection voltage) applied to the bit lines BL can be a low-level voltage (a ground voltage). The transistors Tr4_1 and Tr4_2 serving as fifth switching elements are arranged on the side of the fourth ends $E_{BL2}$ on the opposite side to the third ends $E_{BL1}$ and transmit the selection voltage (the second selection voltage). The transistors Tr3_1 to Tr3_4 and the transistors Tr4_1 and Tr4_2 are connected to different bit lines BL, respectively.

In the tenth embodiment, a plurality of memory cells MCa and MCc driven at the same time correspond to a word line WL to which the transistor Tr1_2 is connected at the first end $E_{WL1}$, and memory cells MCb and MCd correspond to a word line WL to which the transistor Tr2_1 is connected at the second end $E_{WL2}$. The memory cells MCc and MCd correspond to a bit line BL to which the transistor Tr3_3 is connected at the third end $E_{BL1}$ and the memory cells MCa and MCb correspond to a bit line BL to which the transistor Tr4_2 is connected at the fourth end $E_{BL2}$.

In this way, the memory cells MCa to MCd in the memory cell group GR1 driven at the same time are adjacent along two adjacent word lines WL and two adjacent bit lines BL. The selection voltage is applied at the same time to the memory cells group GR1 including these memory cells MCa to MCd. According to the tenth embodiment, the memory cells MC can be efficiently heated in view of the bit lines BL as well as the word lines WL. That is, the bit line driver BLD drives at the same time the memory cells MCc and MCd near the transistor Tr3_3 and the memory cells MCa and MCb far from the transistor Tr4_2, thereby enabling the memory cells MCa and MCb to be efficiently heated with heat of the memory cells MCc and MCd. Accordingly, the bit line driver BLD as well as the word line driver WLD can reliably write data to both the memory cells MCc and MCd near the bit line driver BLD and the memory cells MCa and MCb relatively far from the bit line driver BLD. Memory cell groups GR1 to GR4 may be selected with shifts of two cells (two bits) in the extending direction (the X direction) of the word lines WL, respectively. Alternatively, the memory cell groups GR1 to GR4 may be selected with shifts of two cells (two bits) in the extending direction (the Y direction) of the bit lines BL, respectively.

Each of the memory cell groups GR2 to GR4 is also driven at the same time. Therefore, the same as that for the memory cell group GR1 also holds for the memory cell groups GR2 to GR4.

Other configurations and operations of the semiconductor storage device 1 according to the tenth embodiment may be identical to those of the sixth embodiment. Accordingly, the tenth embodiment can obtain identical effects as those of the sixth embodiment.

Eleventh Embodiment

Figure 16:
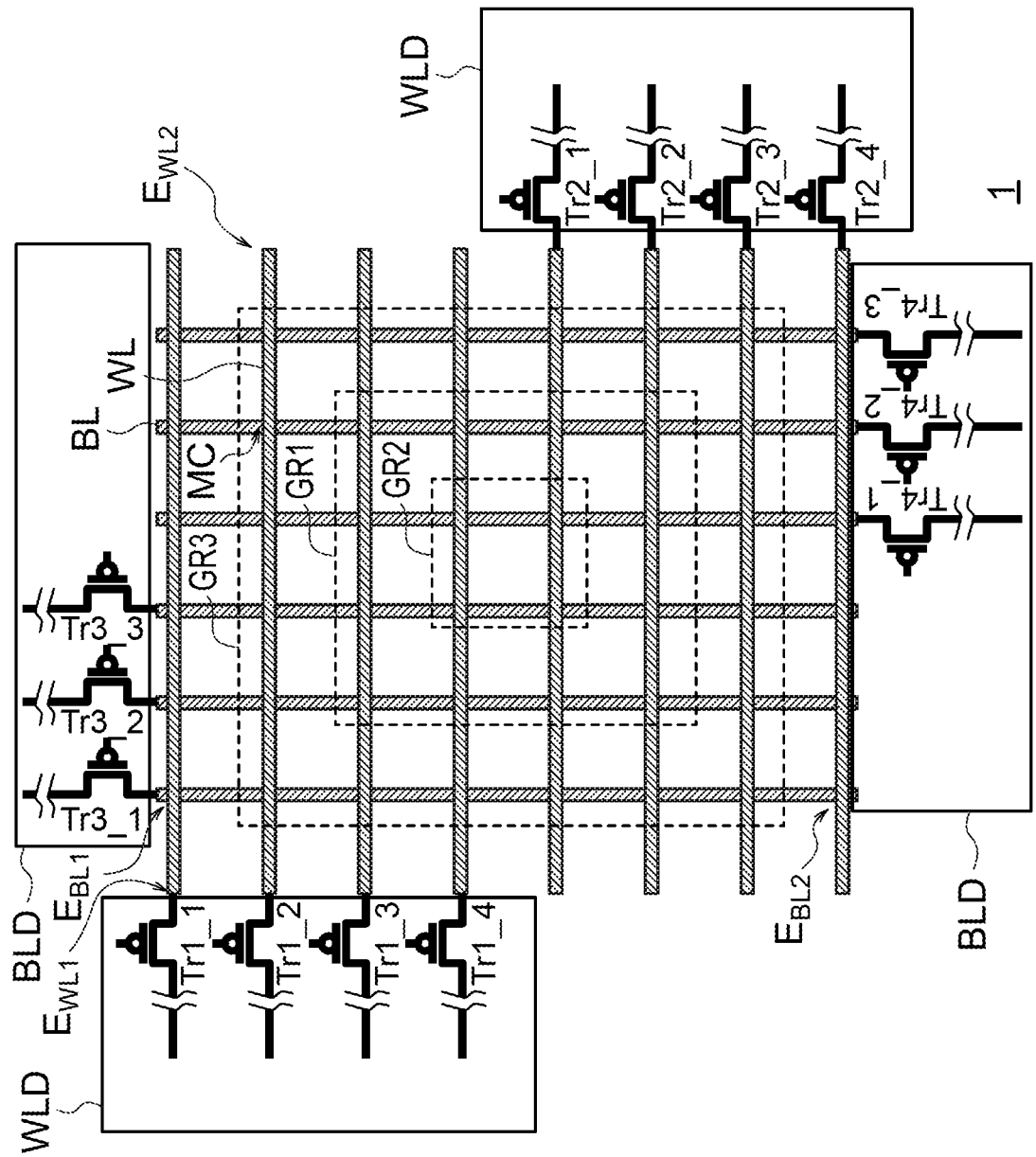
FIG. 16 is a plan view illustrating a configuration example of a semiconductor storage device according to an eleventh embodiment.

FIG. 16 is a plan view illustrating a configuration example of the semiconductor storage device 1 according to an eleventh embodiment. In the eleventh embodiment, transistors Tr3_1 to Tr3_3 respectively connected to the third ends $E_{BL1}$ of the bit lines BL and transistors Tr4_1 to Tr4_3 respectively connected to the fourth ends $E_{BL2}$ thereof are arranged alternately by threes (by halves in a staggered manner) with respect to the bit lines BL in the bit line driver BLD. Other configurations of the eleventh embodiment may be identical to corresponding configurations of the ninth embodiment.

In the eleventh embodiment, 4×4 memory cells arrayed adjacently (successively) along bit lines BL and word lines WL are driven at the same time. The number of the transistors Tr1_3 and Tr1_4 on the side of the first ends $E_{WL1}$ and the number of the transistors Tr2_1 and Tr2_2 on the side of the second ends $E_{WL2}$, that apply the selection voltage at the same time to the memory cell group GR1 including the 16 memory cells MC are respectively two and same. The number of the transistors Tr3_2 and Tr3_3 on the side of the third ends $E_{BL1}$ and the number of the transistors Tr4_1 and Tr4_2 on the side of the fourth ends $E_{BL2}$, that apply the selection voltage at the same time to the memory cell group GR1 are also respectively two and same. The word line driver WLD and the bit line driver BLD may select a memory cell group GR2 or GR3 in an identical manner. The memory cell group GR2 includes four memory cells MC. The memory cell group GR3 includes 36 memory cells MC.

In this way, the transistors Tr1_1 to Tr1_4, Tr2_1 to Tr2_4, Tr3_1 to Tr3_3, and Tr4_1 to Tr4_3 apply the selection voltage at the same time to a plurality of memory cells MC respectively corresponding to intersection regions between a plurality of adjacent word lines WL and a plurality of adjacent bit lines BL.

The numbers of transistors that apply the selection voltage at the same time are same on the sides of the first and second ends $E_{WL1}$ and $E_{WL2}$, and are also same on the sides of the third and fourth ends $E_{BL1}$ and $E_{BL2}$. Accordingly, for example, the number of high-temperature memory cells MC and the number of low-temperature memory cells MC are equal and the high-temperature memory cells and the low-temperature memory cells are adjacent. As a result, heat balance among the memory cells is established and the high-temperature memory cells can more efficiently heat the low-temperature memory cells.

The number of transistors that apply the selection voltage at the same time may be different between the sides of the first ends $E_{WL1}$ and the second ends $E_{WL2}$ to some extent, and may be different between the sides of the third ends $E_{BL1}$ and the fourth ends $E_{BL2}$ to some extent. Although heat balance among the memory cells is not established in this case, high-temperature memory cells can heat low-temperature memory cells.

In the embodiment described above, the transistors Tr3_1, Tr3_2 . . . arranged on the side of the third ends $E_{BL1}$ of the bit lines BL and the transistors Tr4_1, Tr4_2 . . . arranged on the side of the fourth ends $E_{BL2}$ are arranged alternately by n (n is an integer equal to or more than 1) elements with respect to the bit lines BL. The value n is not particularly limited and can be any number. Furthermore, the memory cell group selected at the same time can be any range. For example, the memory cell group GR2 described above is a range of 2×2 memory cells MC, the memory cell group GR1 is a range of 4×4 memory cells MC, and the memory cell group GR3 is a range of 6×6 memory cells MC. However, a memory cell group GR may be a range of p×p (p is an integer equal to or more than 2) memory cells MC or may be a range of p×q (q is an integer different from p and equal to or more than 2) memory cells MC.

Twelfth Embodiment

Figure 17:
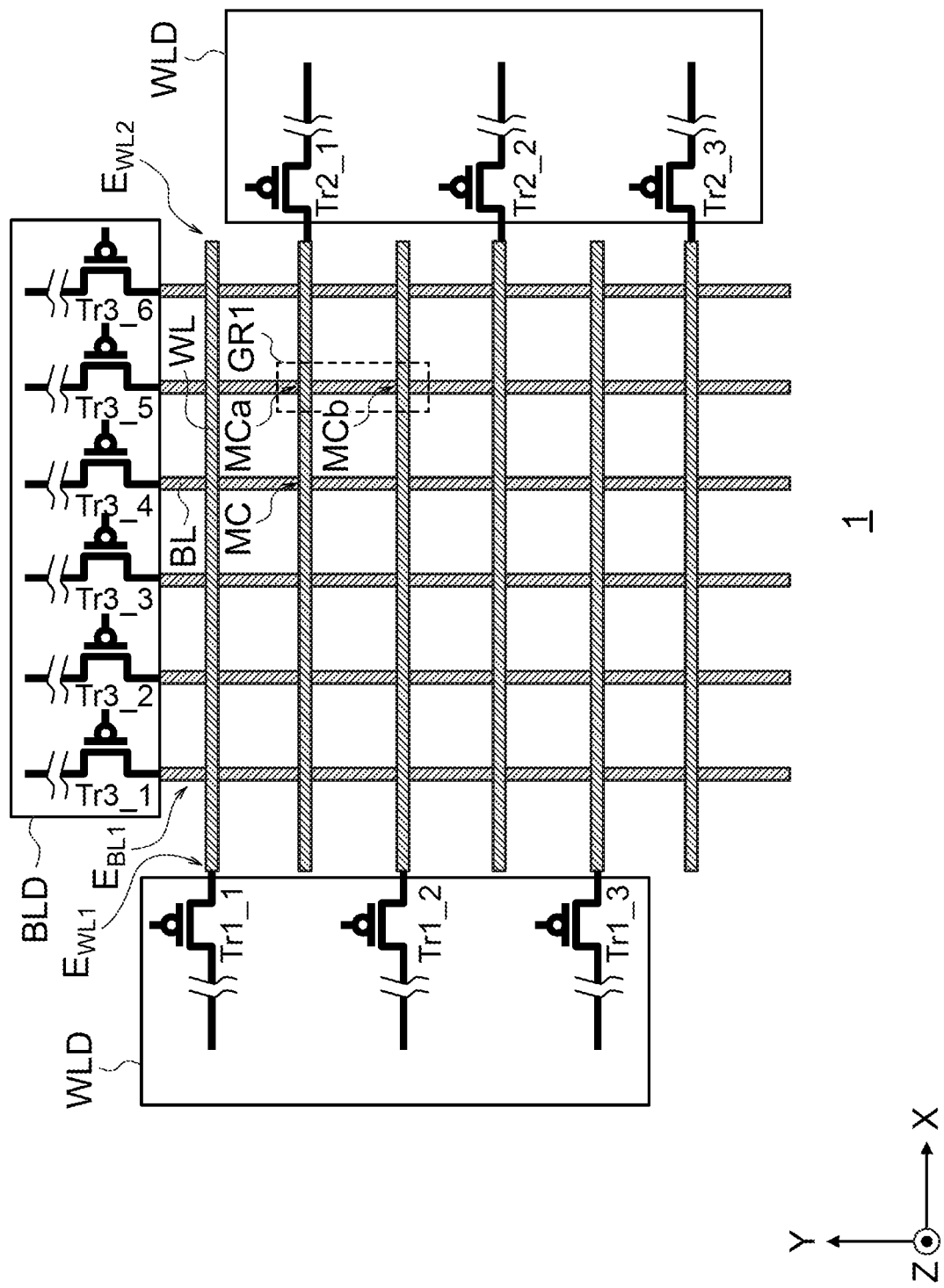
FIG. 17 is a plan view illustrating a configuration example of a semiconductor storage device according to a twelfth embodiment.

FIG. 17 is a plan view illustrating a configuration example of the semiconductor storage device 1 according to a twelfth embodiment. In the twelfth embodiment, the word line driver WLD is dispersedly arranged at the first ends $E_{WL1}$ and the second ends $E_{WL2}$ of the word lines WL similarly to other embodiments. On the other hand, the bit line driver BLD is arranged at the third ends $E_{BL1}$ on one side of the bit lines BL. That is, the bit line driver BLD includes transistors Tr3_1 to Tr3_6 connected only to the third ends $E_{BL1}$ of the bit lines BL and no transistors of the bit line driver BLD are connected to the fourth ends $E_{BL2}$. Other configurations of the twelfth embodiment may be identical to corresponding configurations of the first embodiment.

Since the bit line driver BLD is arranged only on one side of the bit lines BL, voltage drop of the selection voltage applied to memory cells MC far from the bit line driver BLD is large. However, the configuration of the twelfth embodiment may be used in cases of a circumstance where the wiring resistance of the bit lines BL is lower than that of the word lines WL, and the like. For example, when the wiring thickness of the bit lines BL is larger than that of the word lines WL, when the wiring width of the bit lines BL is larger than that of the word lines WL, or when the material of the bit lines BL is different from that of the word lines WL, the wiring resistance of the bit lines BL is likely to be lower than that of the word lines WL.

The arrangement of the bit line driver BLD at the third ends $E_{BL1}$ on one side of the bit lines BL can reduce the arrangement area of the bit line driver BLD.

Thirteenth Embodiment

Figure 18:
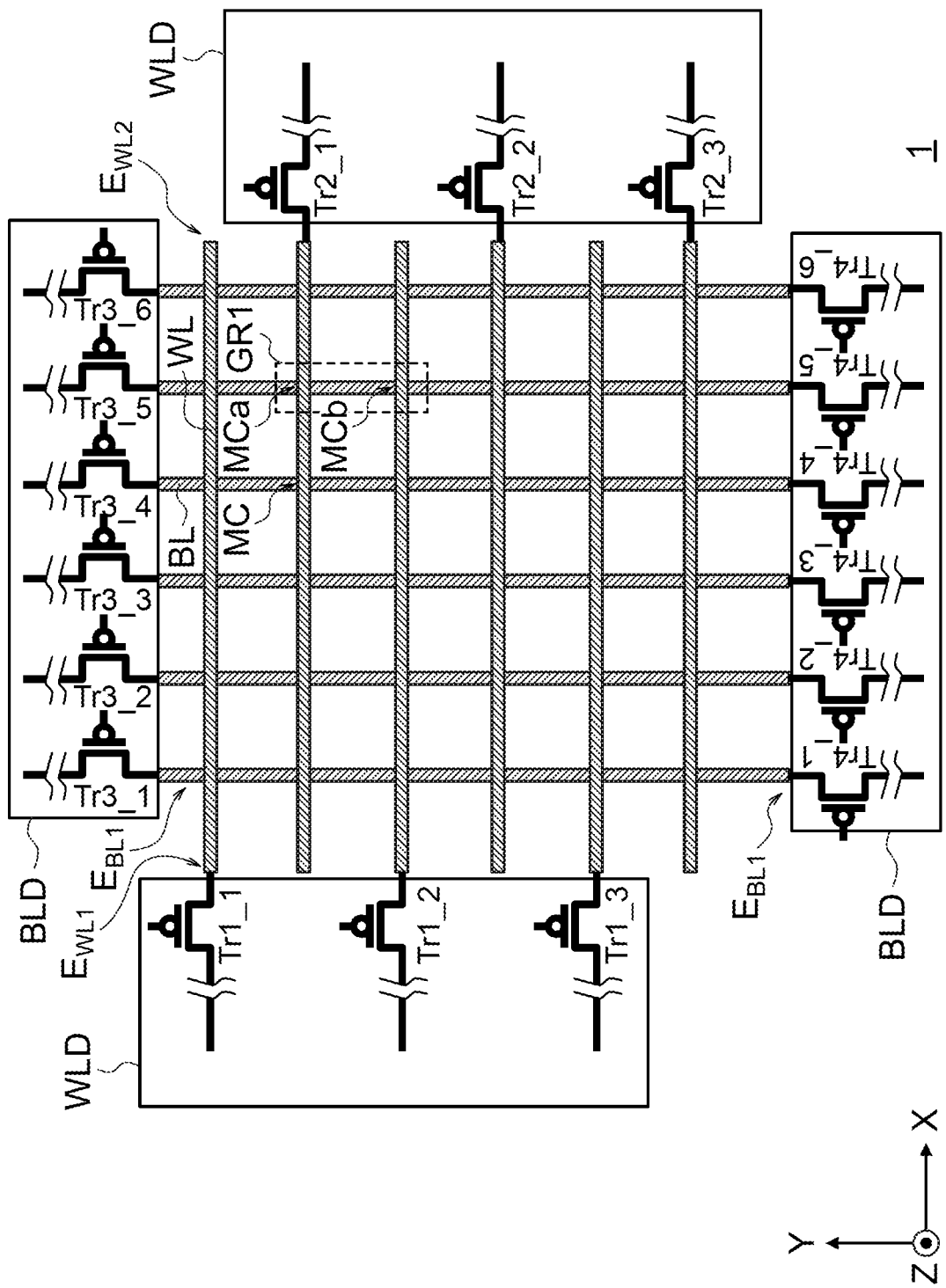
FIG. 18 is a plan view illustrating a configuration example of a semiconductor storage device according to a thirteenth embodiment.

FIG. 18 is a plan view illustrating a configuration example of the semiconductor storage device 1 according to a thirteenth embodiment. In the thirteenth embodiment, the bit line driver BLD is arranged on both sides of the third and fourth ends $E_{BL1}$ and $E_{BL2}$ of the bit lines BL. That is, the bit line driver BLD includes transistors Tr3_1 to Tr3_6 respectively connected to the third ends $E_{BL1}$ of the bit lines BL and transistors Tr4_1 to Tr4_6 respectively connected to the fourth ends $E_{BL2}$ of the bit lines BL. Other configurations of the thirteenth embodiment may be identical to corresponding configurations of the first embodiment.

Since the bit line driver BLD is arranged on the both sides of the bit lines BL, voltage drop of the selection voltage applied from the bit line driver BLD to each of memory cells MC is smaller. Therefore, the bit line driver BLD can pass a relatively large current to each of the memory cells MC. Accordingly, the thirteenth embodiment is advantageous when the wiring resistance of the bit lines BL is higher than that of the word lines WL. For example, when the wiring thickness of the bit lines BL is smaller than that of the word lines WL, when the wiring width of the bit lines BL is smaller than that of the word lines WL, or when the material of the bit lines BL is different from that of the word lines WL, the wiring resistance of the bit lines BL is likely to be higher than that of the word lines WL.

While the twelfth and thirteenth embodiments have been explained for the bit line driver BLD, the same holds for the word line driver WLD.

Fourteenth Embodiment

Figure 19A:
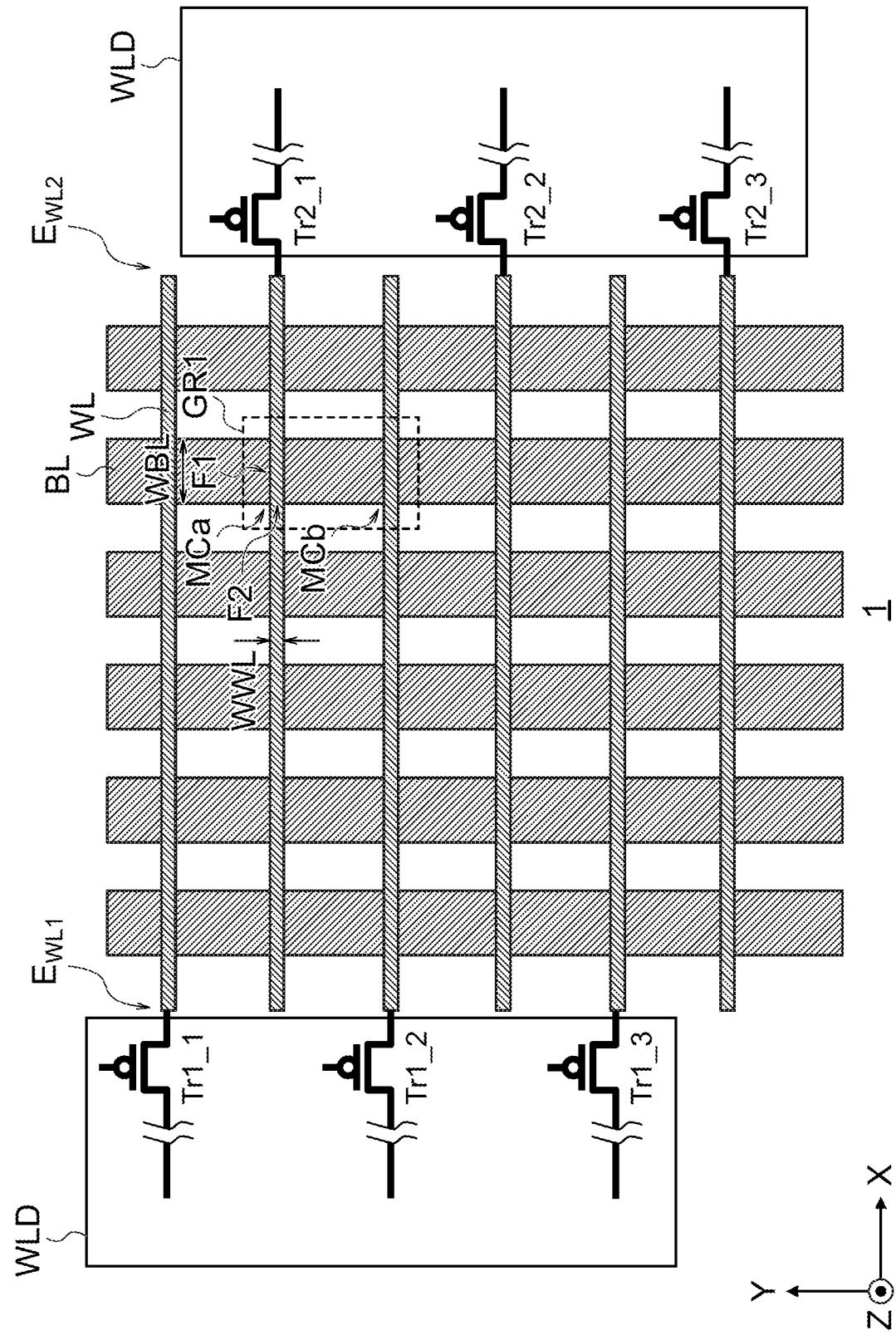
FIG. 19A is a plan view illustrating a configuration example of a semiconductor storage device according to a fourteenth embodiment.
Figure 19B:
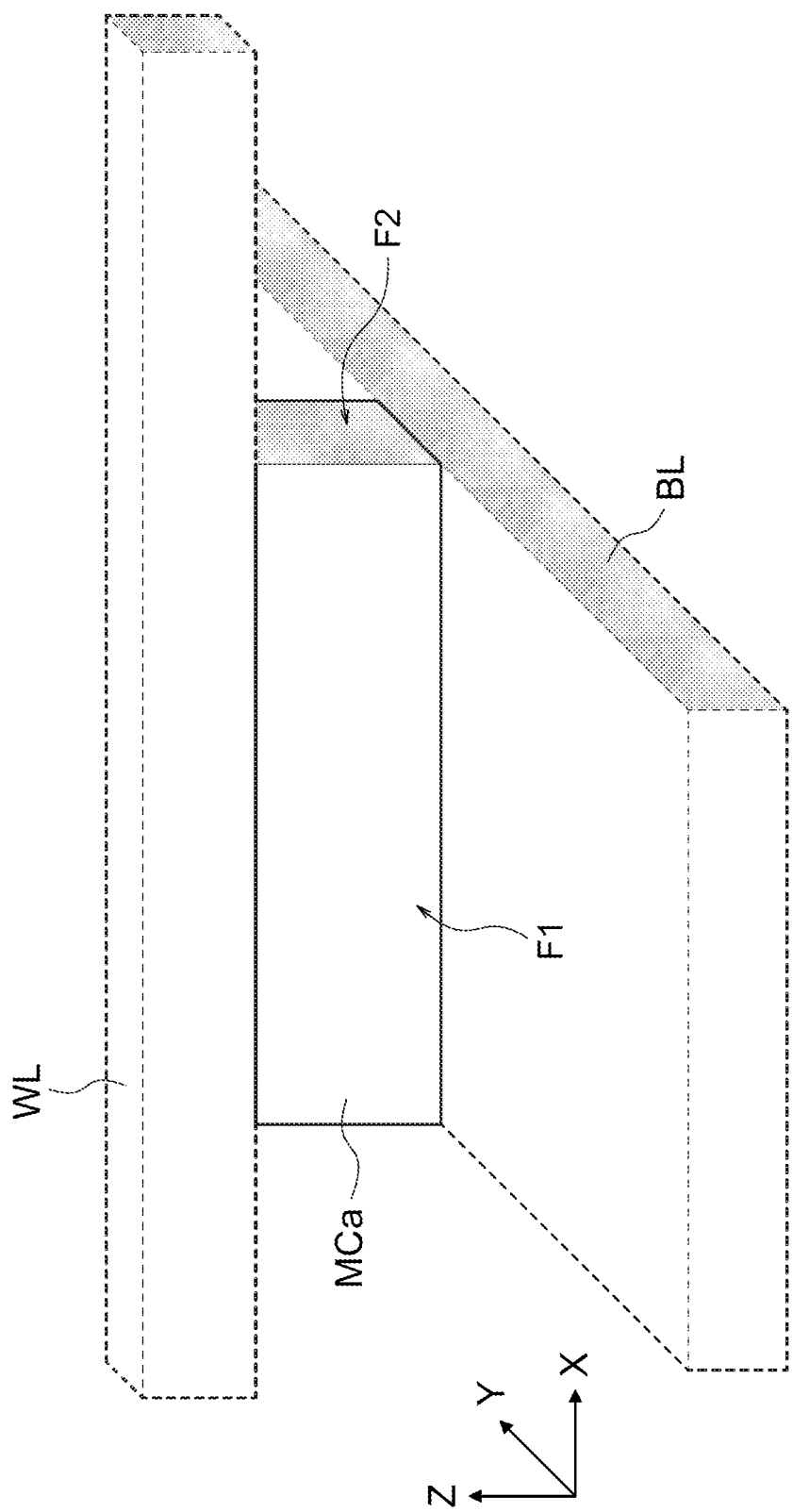
FIG. 19B is a perspective view illustrating the configuration example of the semiconductor storage device according to the fourteenth embodiment.

FIG. 19A is a plan view illustrating a configuration example of the semiconductor storage device 1 according to a fourteenth embodiment. FIG. 19B is a perspective view illustrating a configuration example of a memory cell according to the fourteenth embodiment. In the fourteenth embodiment, a width WBL of the bit lines BL in the X direction is larger than a width WWL of the word lines WL in the Y direction. Therefore, the wiring resistance of the bit lines BL is lower than that of the word lines WL. As illustrated in FIG. 19A, each memory cell MC is substantially quadrangular (for example, rectangular) in a planar view seen from above the surface of the semiconductor substrate 10. The width of a face F1 facing in the extending direction (the Y direction) of the bit lines BL among four sides of the memory cell MC is substantially equal to the width WBL. The width of a face F2 facing in the extending direction (the X direction) of the word lines WL is substantially equal to the width WWL.

Memory cells MCa and MCb in the memory cell group GR1 selected at the same time are adjacent on the side of the face F1 and face each other on the face F1. As illustrated in FIG. 19B, the face F1 is larger in the width than the face F2 and has a larger area. That is, the faces F1 of memory cells MC facing in the extending direction (the Y direction) of the bit lines BL are larger than the faces F2 of memory cells MC facing in the extending direction (the X direction) of the word lines WL. Therefore, the area of the faces F1 facing each other of the memory cells MCa and MCb adjacent in the Y direction and selected at the same time is larger than the area of the faces F2 facing each other of the memory cells adjacent in the X direction and not selected at the same time. Accordingly, heat can be more efficiently transmitted between the memory cells MCa and MCb selected at the same time.

Other configurations of the fourteenth embodiment may be identical to corresponding configurations of the first embodiment. Accordingly, the fourteenth embodiment can obtain identical effects as those of the first embodiment.

Fifteenth Embodiment

Figure 20:
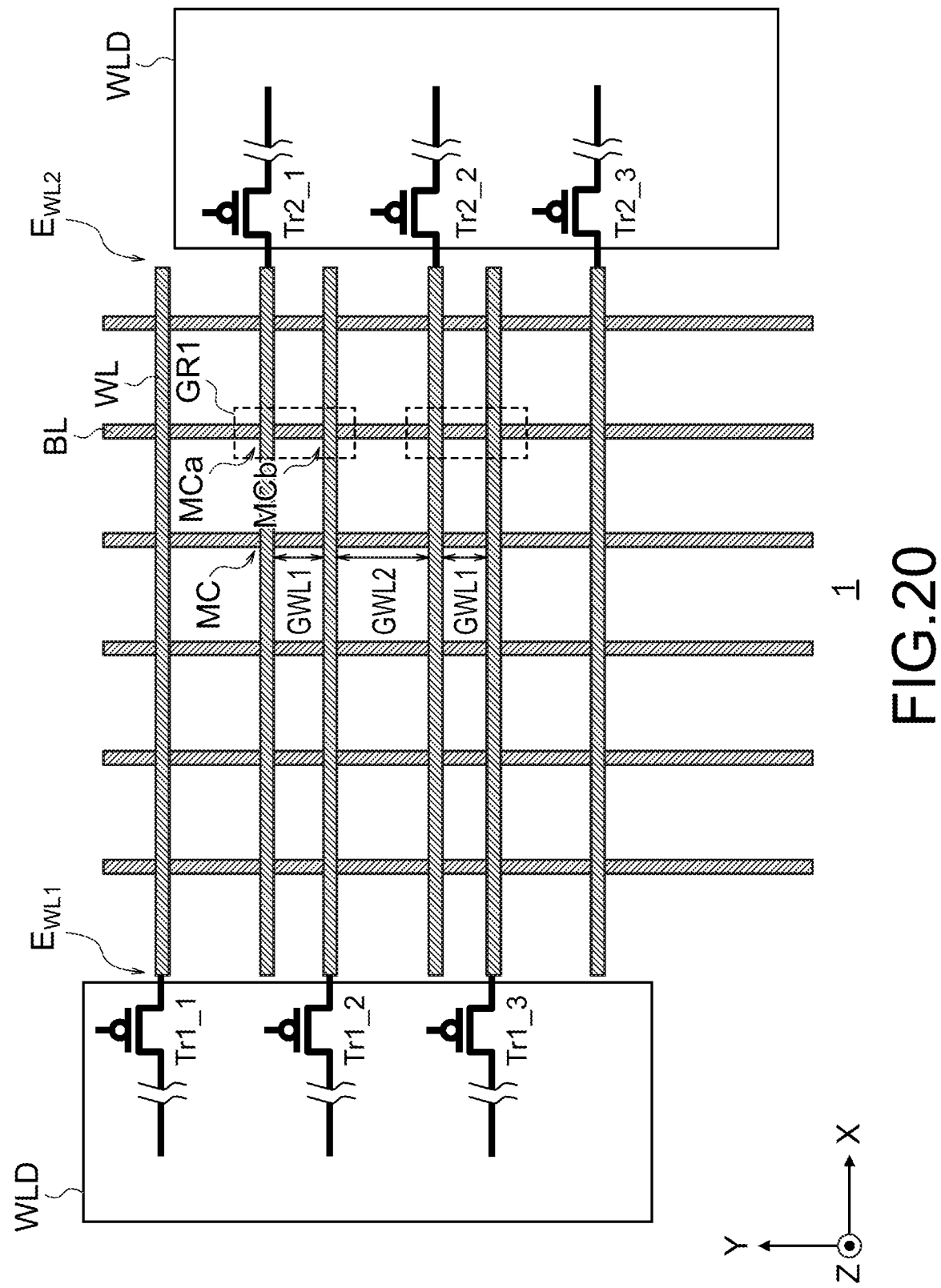
FIG. 20 is a plan view illustrating a configuration example of a semiconductor storage device according to a fifteenth embodiment.

FIG. 20 is a plan view illustrating a configuration example of the semiconductor storage device 1 according to a fifteenth embodiment. In the fifteenth embodiment, an array gap GWL1 between two adjacent word lines WL that transmit the selection voltage at the same time is narrower than an array gap GWL2 between two adjacent word lines WL that do not transmit the selection voltage at the same time. In other words, the distance (GWL1) between memory cells MCa and MCb to which the selection voltage is applied at the same time is smaller than the distance (GWL2) between memory cells to which the selection voltage is applied at different timings. Accordingly, the gap between the memory cells MCa and MCb selected at the same time is narrower and heat can be more efficiently transmitted between the memory cells MCa and MCb.

Other configurations of the fifteenth embodiment may be identical to corresponding configurations of the first embodiment. Accordingly, the fifteenth embodiment can obtain identical effects as those of the first embodiment.

Sixteenth Embodiment

Figure 21:
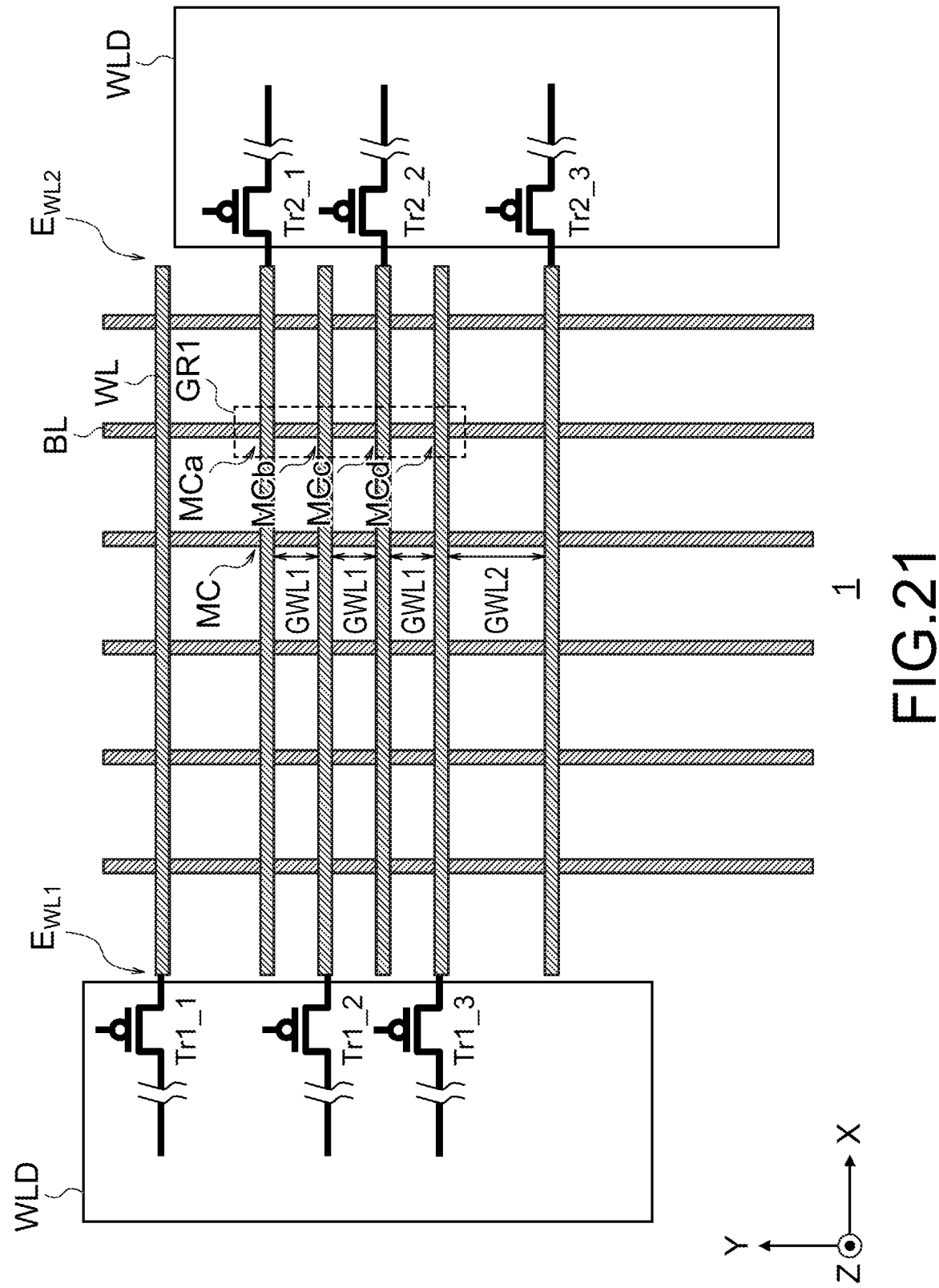
FIG. 21 is a plan view illustrating a configuration example of a semiconductor storage device according to a sixteenth embodiment.

FIG. 21 is a plan view illustrating a configuration example of the semiconductor storage device 1 according to a sixteenth embodiment. In the sixteenth embodiment, the array gaps GWL1 between four adjacent word lines WL that transmit the selection voltage at the same time are narrower than the array gaps GWL2 between other adjacent word lines WL that do not transmit the selection voltage at the same time. Accordingly, the gaps between memory cells MCa to MCd selected at the same time are narrower and heat can be more efficiently transmitted among the memory cells MCa to MCd.

Other configurations of the sixteenth embodiment may be identical to corresponding configurations of the second embodiment. Accordingly, the sixteenth embodiment can obtain identical effects as those of the second embodiment.

Seventeenth Embodiment

Figure 22:
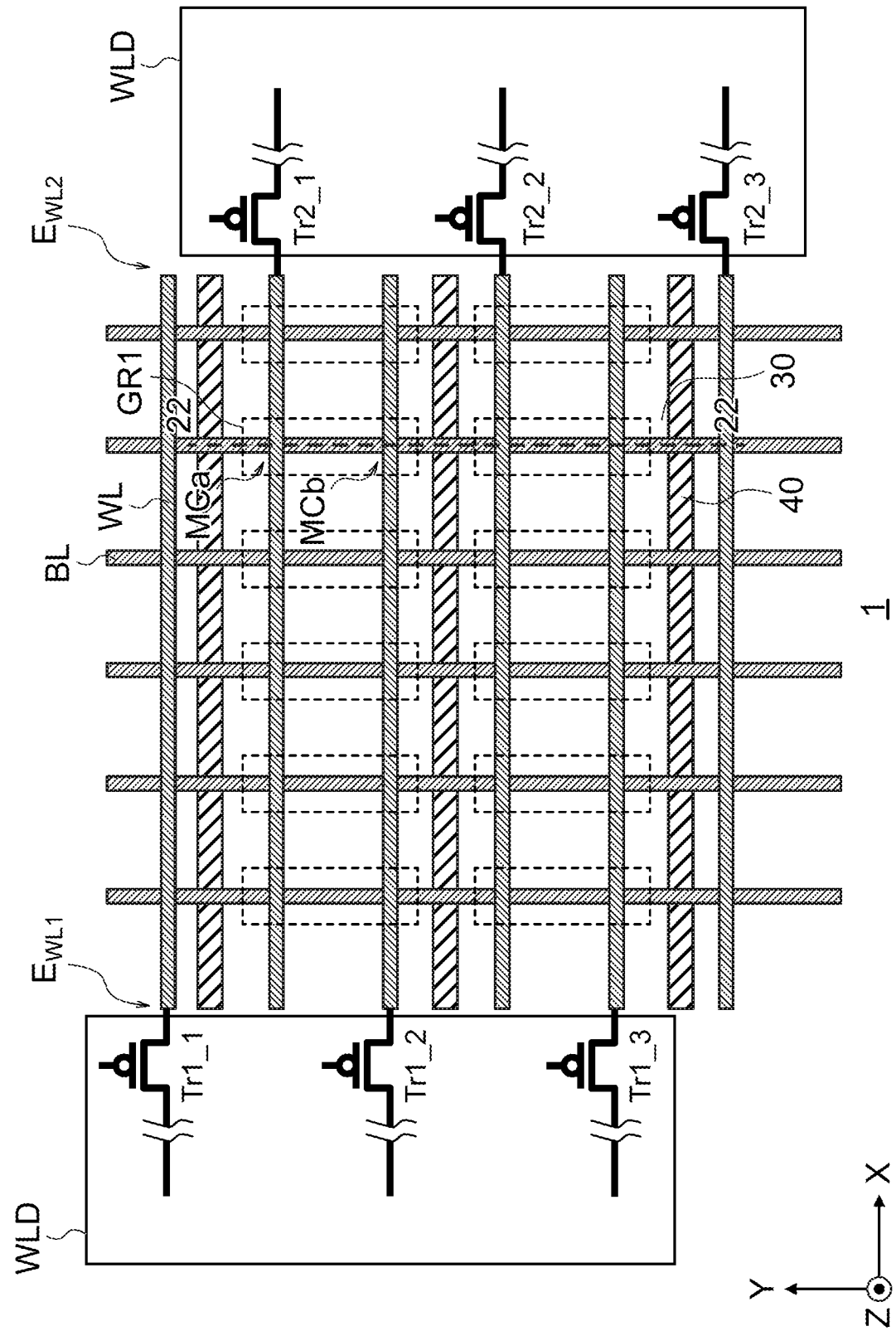
FIG. 22 is a plan view illustrating a configuration example of a semiconductor storage device according to a seventeenth embodiment.
Figure 23:
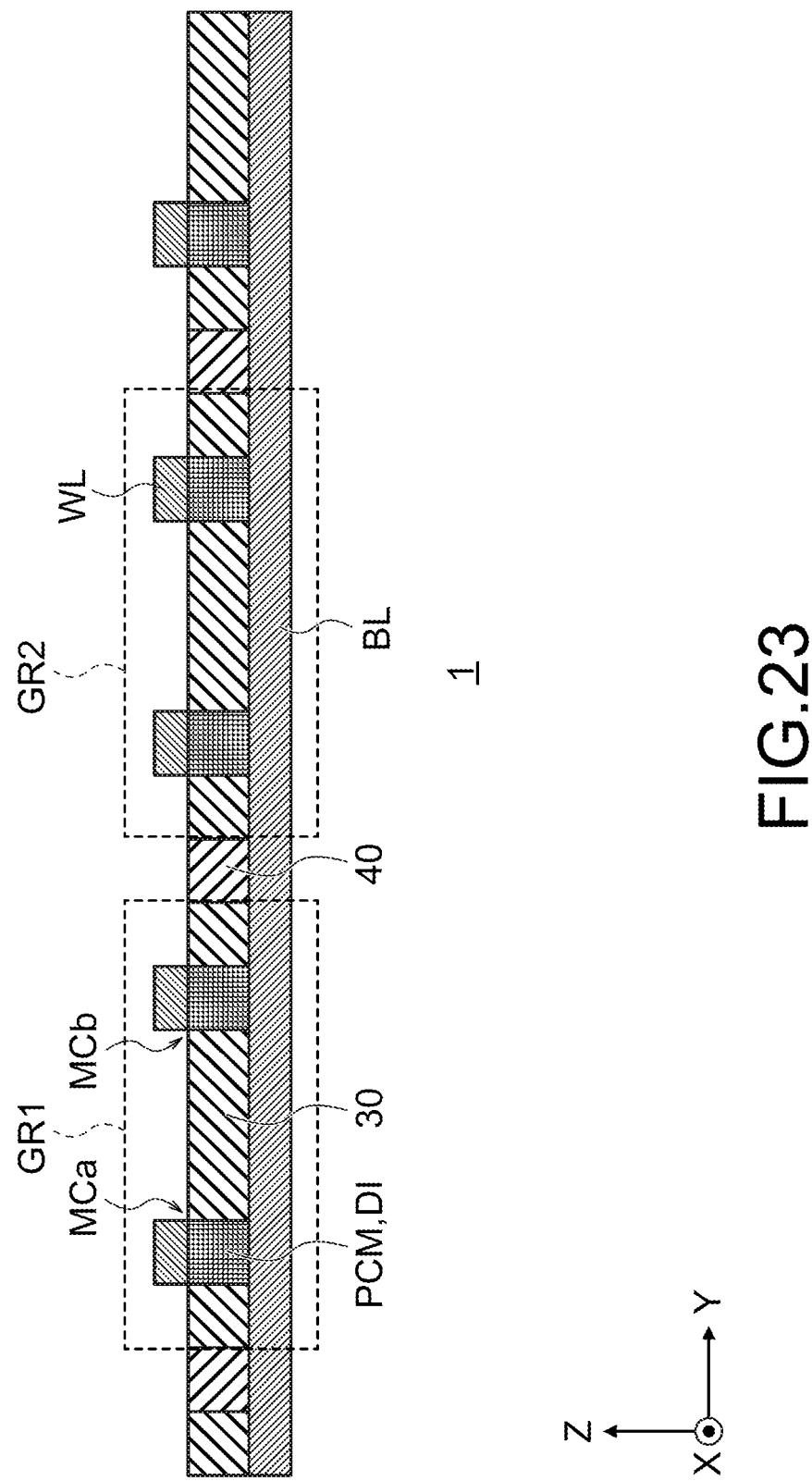
FIG. 23 is a sectional view illustrating the configuration example of the semiconductor storage device according to the seventeenth embodiment.

FIG. 22 is a plan view illustrating a configuration example of the semiconductor storage device 1 according to a seventeenth embodiment. FIG. 23 is a sectional view illustrating the configuration example of the semiconductor storage device 1 according to the seventeenth embodiment. FIG. 23 illustrates a cross section along a line 22-22 (a bit line BL) in FIG. 22. Illustrations of the semiconductor substrate 10 and the interlayer dielectric film 20 are omitted.

As illustrated in FIG. 23, an insulating film 30 being a first insulating film is provided between memory cells MCa and MCb in the memory cell group GR1 to which the selection voltage is applied at the same time (a first structure). The insulating film 30 is also provided between memory cells MC in the memory cell group GR2 to which the selection voltage is applied at the same time. Meanwhile, an insulating film 40 being a second insulating film is provided between memory cells MC to which the selection voltage is applied at different timings (a second structure). That is, both the insulating film 30 and the insulating film 40 are provided between the memory cell group GR1 and the memory cell group GR2 adjacent to each other. The second structure is a three-layer structure including the insulating film 30, the insulating film 40, and the insulating film 30 in the Y direction.

As illustrated in FIG. 22, the insulating films 40 extend in the X direction between memory cell groups in a planar view seen from above the surface of the semiconductor substrate 10. Since it suffices that the insulating films 40 are provided between memory cell groups, the insulating films 40 may be provided continuously as illustrated in FIG. 22 or may be provided discontinuously only between memory cell groups.

The insulating films 30 and 40 are made of materials different from each other. The insulating films 40 are made of a material lower in the thermal conductivity than the insulating films 30. For example, $SiO_2$ is used as the insulating films 30. For example, SiN or SiCN is used as the insulating films 40. Since the thermal conductivity of the insulating films 40 is relatively low, not so much heat is exchanged between memory cells MC that are not selected at the same time. On the other hand, the thermal conductivity of the insulating films 30 is relatively high and the memory cells MCa and MCb in the memory cell group GR1 can efficiently exchange heat with each other. Accordingly, data write or read can be efficiently performed in the memory cell groups GR1 and GR2. Further, heat transfer between adjacent memory cell groups GR1 and GR2 can be suppressed to some extent.

The insulating films 30 and 40 may be provided between adjacent word lines WL or adjacent bit lines BL as well as between memory cells MC. The insulating films 30 and 40 may be provided entirely around the memory cells MC, or partially therearound. The insulating films 30 and 40 may be provided entirely from the bottom surface to the top surface of each of the memory cells MC, or partially thereof.

Other configurations of the seventeenth embodiment may be identical to corresponding configurations of the first embodiment. Accordingly, the seventeenth embodiment can obtain identical effects as those of the first embodiment.

Eighteenth Embodiment

Figure 24:
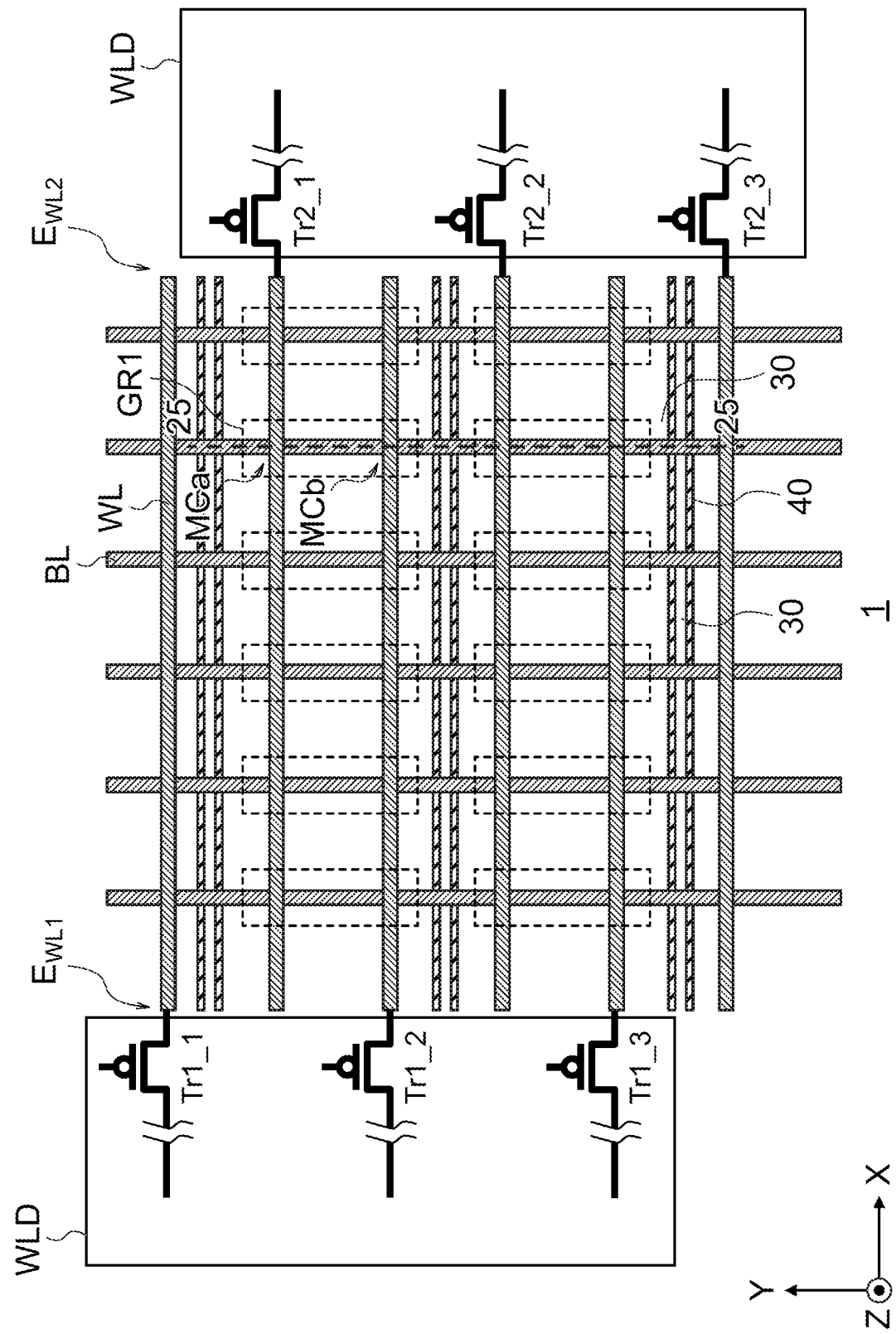
FIG. 24 is a plan view illustrating a configuration example of a semiconductor storage device according to an eighteenth embodiment.
Figure 25:
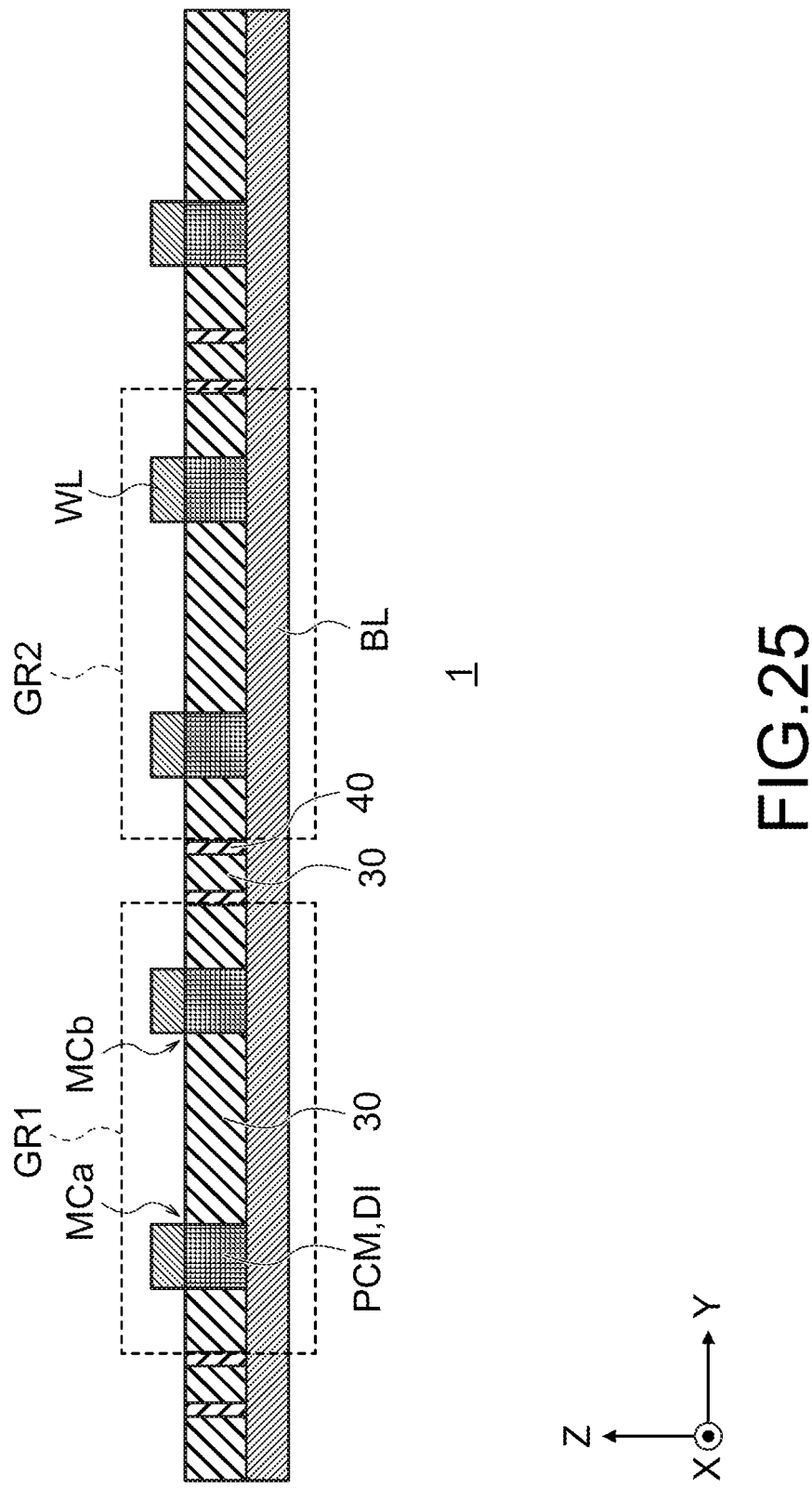
FIG. 25 is a sectional view illustrating the configuration example of the semiconductor storage device according to the eighteenth embodiment.

FIG. 24 is a plan view illustrating a configuration example of the semiconductor storage device 1 according to an eighteenth embodiment. FIG. 25 is a sectional view illustrating the configuration example of the semiconductor storage device 1 according to the eighteenth embodiment. FIG. 25 illustrates a cross section along a line 25-25 (a bit line BL) in FIG. 24. In the eighteenth embodiment, the insulating film 30 is provided also in the insulating film 40 and the second structure is multilayered in the Y direction between memory cells MC to which the selection voltage is applied at different timings. For example, the second structure is a five-layer structure including the insulating films 30 and 40 in the Y direction as illustrated in FIG. 25. The first structure between memory cells MC to which the selection voltage is applied at the same time is a one-layer structure including the insulating film 30 in the Y direction. In this way, the number of films included in the second structure is larger than the number of films included in the first structure in the eighteenth embodiment. This enables the thermal conductivity of the second structure to be lower than that of the first structure. Other configurations of the eighteenth embodiment may be identical to corresponding configurations of the seventeenth embodiment. Accordingly, the eighteenth embodiment can obtain identical effects as those of the seventeenth embodiment.

Since it suffices that the insulating films 40 are provided between memory cell groups, the insulating films 40 may be provided continuously as illustrated in FIG. 24 or may be provided discontinuously only between memory cell groups. The insulating film 30 in each of the insulating films 40 also may be provided continuously or may be provided discontinuously only between memory cell groups.

Nineteenth Embodiment

Figure 26:
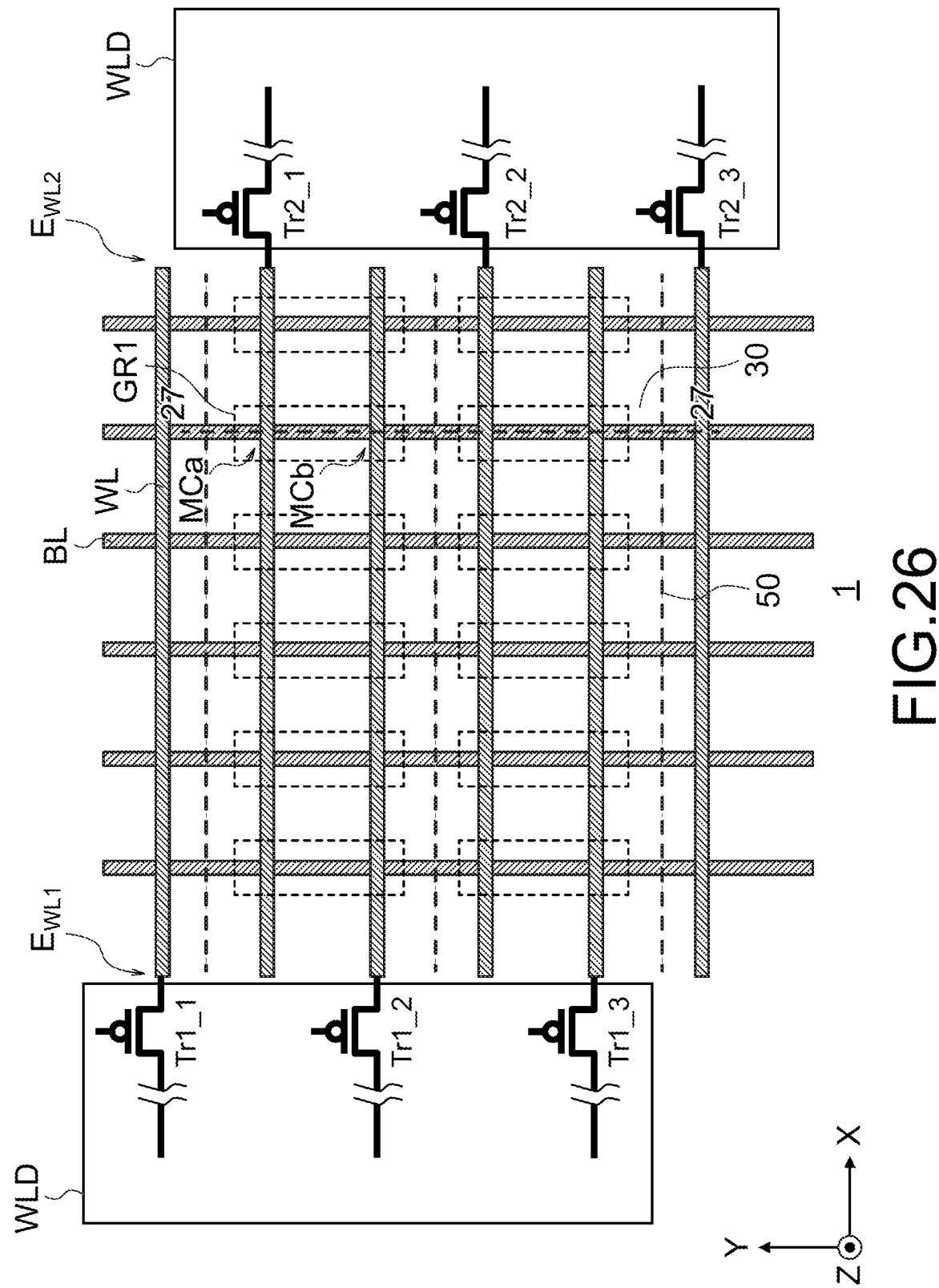
FIG. 26 is a plan view illustrating a configuration example of a semiconductor storage device according to a nineteenth embodiment.
Figure 27:
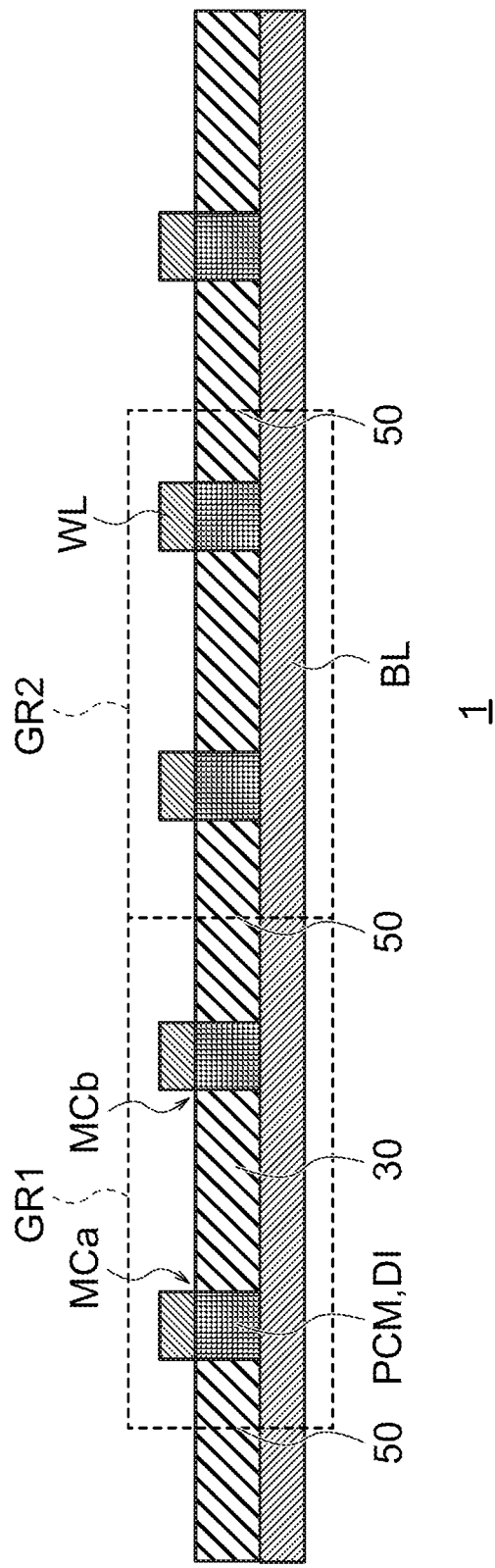
FIG. 27 is a sectional view illustrating the configuration example of the semiconductor storage device according to the nineteenth embodiment.

FIG. 26 is a plan view illustrating a configuration example of the semiconductor storage device 1 according to a nineteenth embodiment. FIG. 27 is a sectional view illustrating the configuration example of the semiconductor storage device 1 according to the nineteenth embodiment. FIG. 27 illustrates a cross section along a line 27-27 (a bit line BL) in FIG. 26. In the nineteenth embodiment, the insulating films 40 are omitted and the second structure has an interface 50 in the insulating film 30 between memory cells MC to which the selection voltage is applied at different timings. The first structure between memory cells MC to which the selection voltage is applied at the same time is same as that in the seventeenth embodiment. In this way, the insulating film 30 in the second structure has interfaces in the nineteenth embodiment. In order to form the interfaces 50, it suffices to form the insulating film 30 in plural parts.

With the interfaces 50 included in the insulating film 30, the thermal conductivity of the second structure can be reduced relative to that of the first structure. Other configurations of the nineteenth embodiment may be identical to corresponding configurations of the seventeenth embodiment. Accordingly, the nineteenth embodiment can obtain identical effects as those of the seventeenth embodiment.

While the second structure can be a single structure, the second structures according to the seventeenth to nineteenth embodiments may be mixed. For example, the second structure between certain memory cell groups may be the second structure illustrated in FIG. 22 and the second structure between other memory cell groups may be the second structure illustrated in FIG. 24.

While the cross section taken along the extending direction (the Y direction) of the bit lines BL has been explained in the seventeenth to nineteenth embodiments, a cross section taken along the extending direction (the X direction) of the word lines WL may have an identical structure. This enables adjacent memory cells MC in the memory cell group GR1 or the like to efficiently exchange heat with each other also in the extending direction (the X direction) of the word lines WL as in the embodiments illustrated in FIGS. 9, 15, and 16. Furthermore, heat transfer between adjacent memory cell groups can be suppressed to some extent. Accordingly, in this case, the fifth, tenth, and eleventh embodiments can also obtain identical effects as those of the seventeenth to nineteenth embodiments.

Twentieth Embodiment

Figure 28:
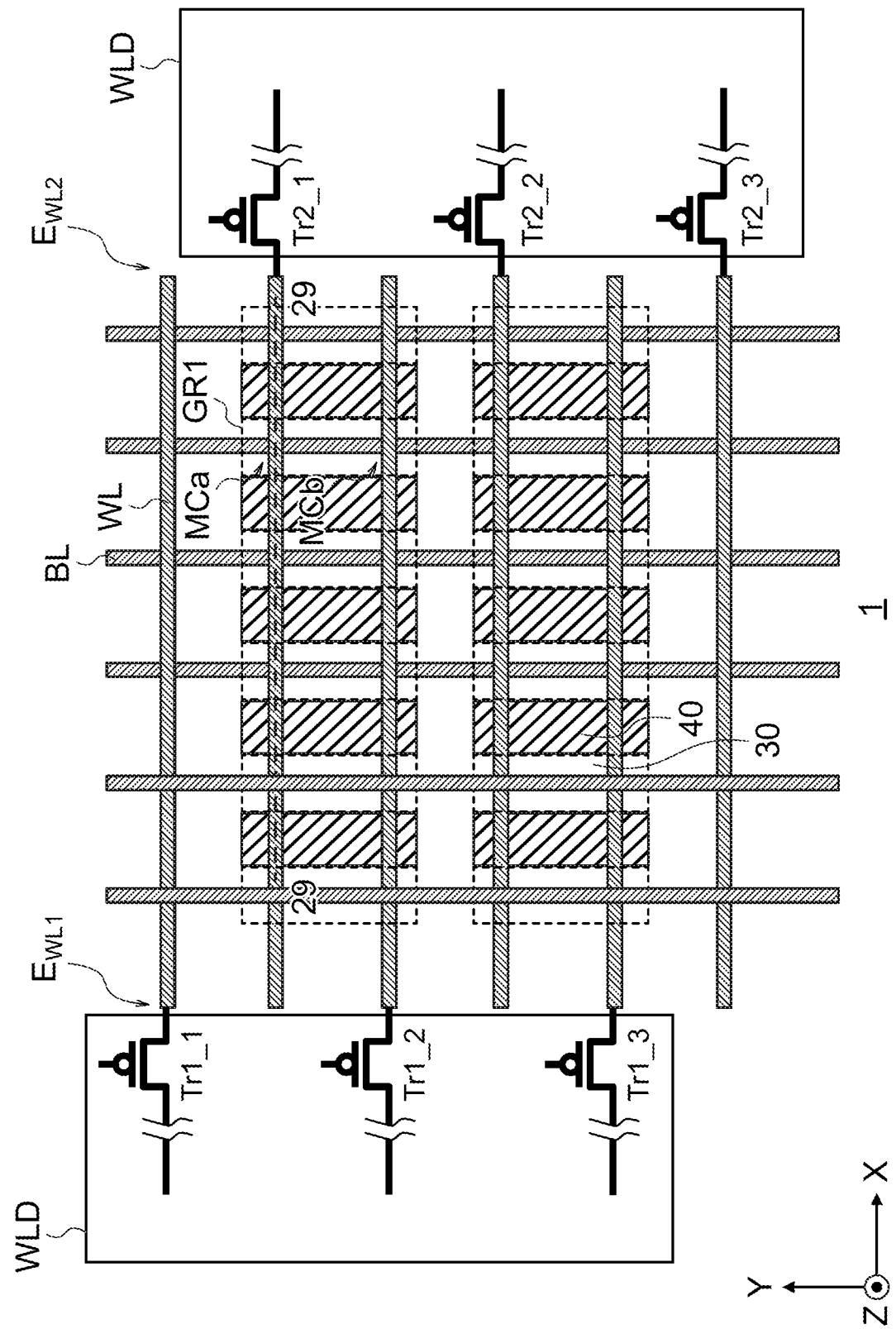
FIG. 28 is a plan view illustrating a configuration example of a semiconductor storage device according to a twentieth embodiment.
Figure 29:
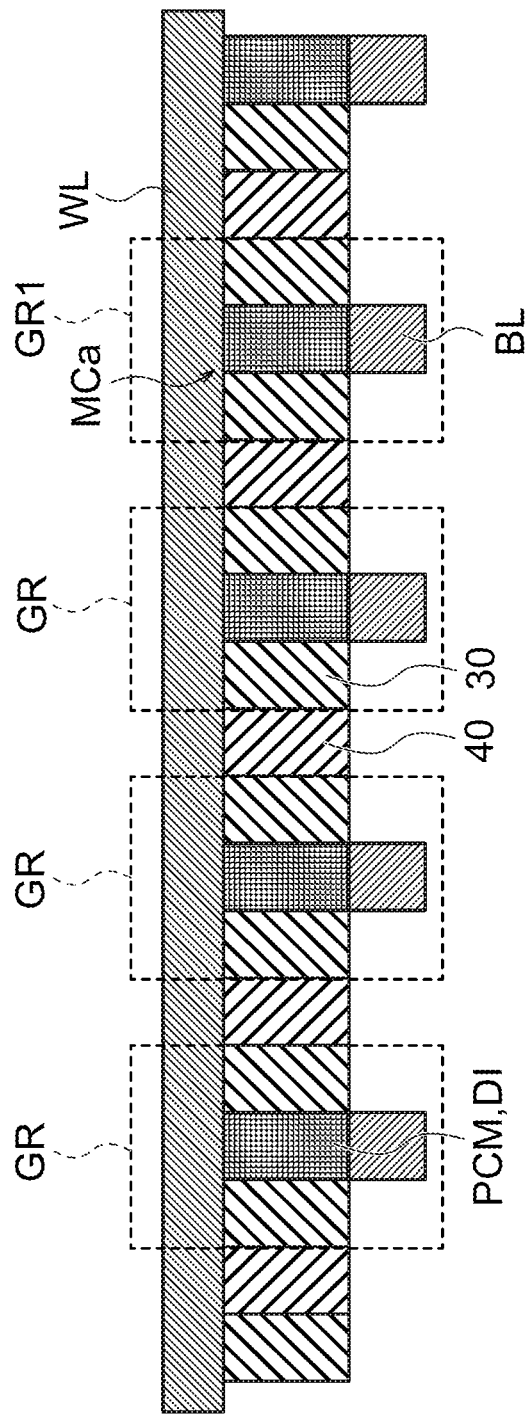
FIG. 29 is a sectional view illustrating the configuration example of the semiconductor storage device according to the twentieth embodiment.

FIG. 28 is a plan view illustrating a configuration example of the semiconductor storage device 1 according to a twentieth embodiment. FIG. 29 is a sectional view illustrating the configuration example of the semiconductor storage device 1 according to the twentieth embodiment. FIG. 29 illustrates a cross section along a line 29-29 (a word line WL) in FIG. 28.

In the twentieth embodiment, the second structure is provided between memory cell groups GR adjacent to each other in the X direction. That is, the insulating films 30 and 40 are provided as a three-layer structure in the X direction between memory cell groups GR adjacent to each other.

As illustrated in FIG. 28, the insulating films 40 extend in the Y direction between memory cell groups GR in a planar view seen from above the surface of the semiconductor substrate 10. Since being relatively low in the thermal conductivity, the insulating films 40 can suppress heat transfer between adjacent memory cell groups GR.

Figure 30:
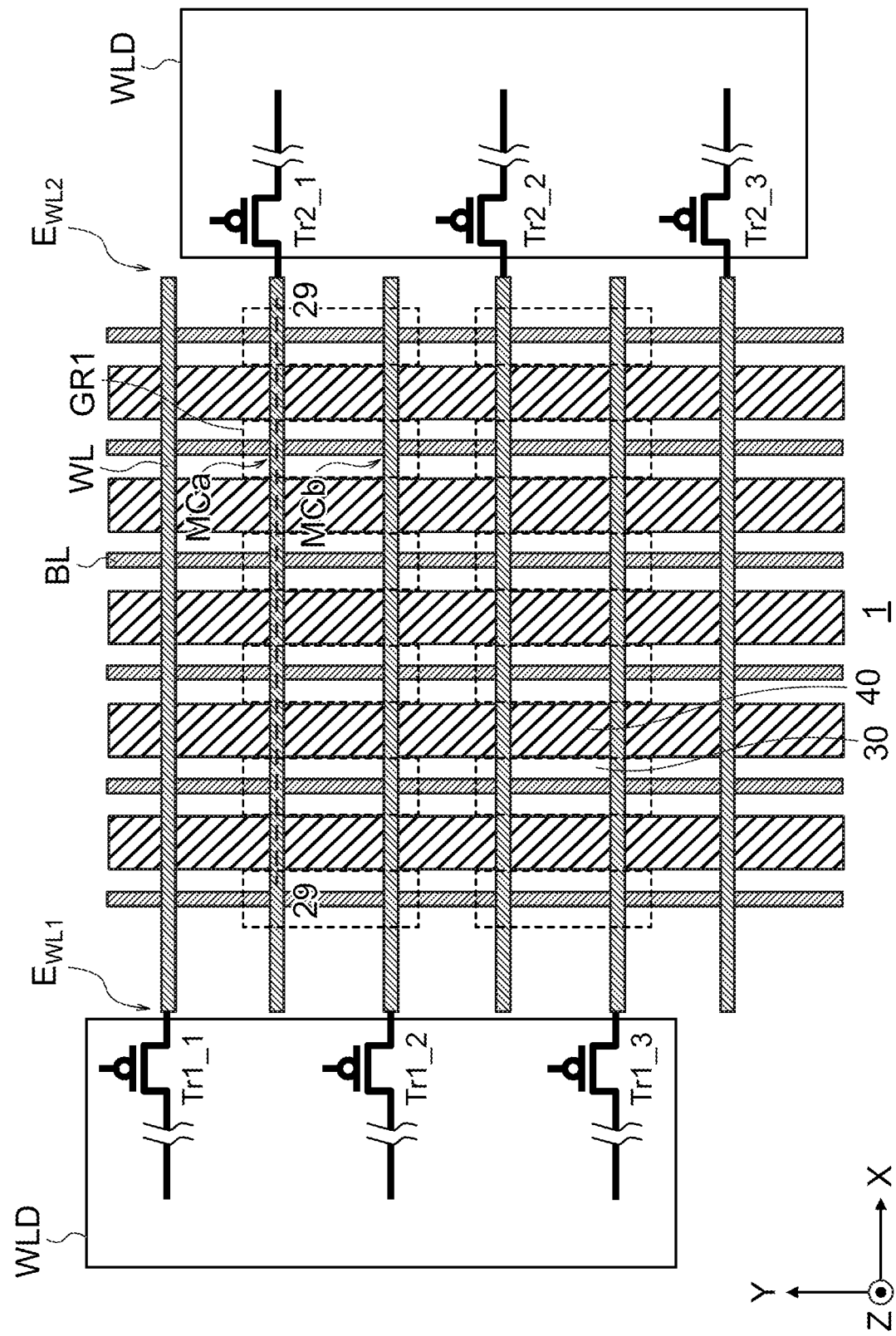
FIG. 30 is a plan view illustrating a configuration example of a semiconductor storage device according to a modification of the twentieth embodiment.

The insulating films 40 may be provided discontinuously between memory cell groups GR as illustrated in FIG. 28. Alternatively, the insulating films 40 may be provided continuously in the Y direction. For example, FIG. 30 is a plan view illustrating a configuration example of the semiconductor storage device 1 according to a modification of the twentieth embodiment. The insulating films 40 may be provided continuously in the Y direction as in this modification.

The insulating films 30 and 40 may be provided between adjacent word lines WL or adjacent bit lines BL as well as between memory cells MC. The insulating films 30 and 40 may be provided entirely around the memory cells MC or partially therearound. The insulating films 30 and 40 may be provided entirely from the bottom surface to the top surface of each of the memory cells MC or partially thereof.

Other configurations of the twentieth embodiment may be identical to corresponding configurations of the first embodiment. Accordingly, the twentieth embodiment can obtain identical effects as those of the first embodiment. The twentieth embodiment may be combined with other embodiments.

Figure 31:
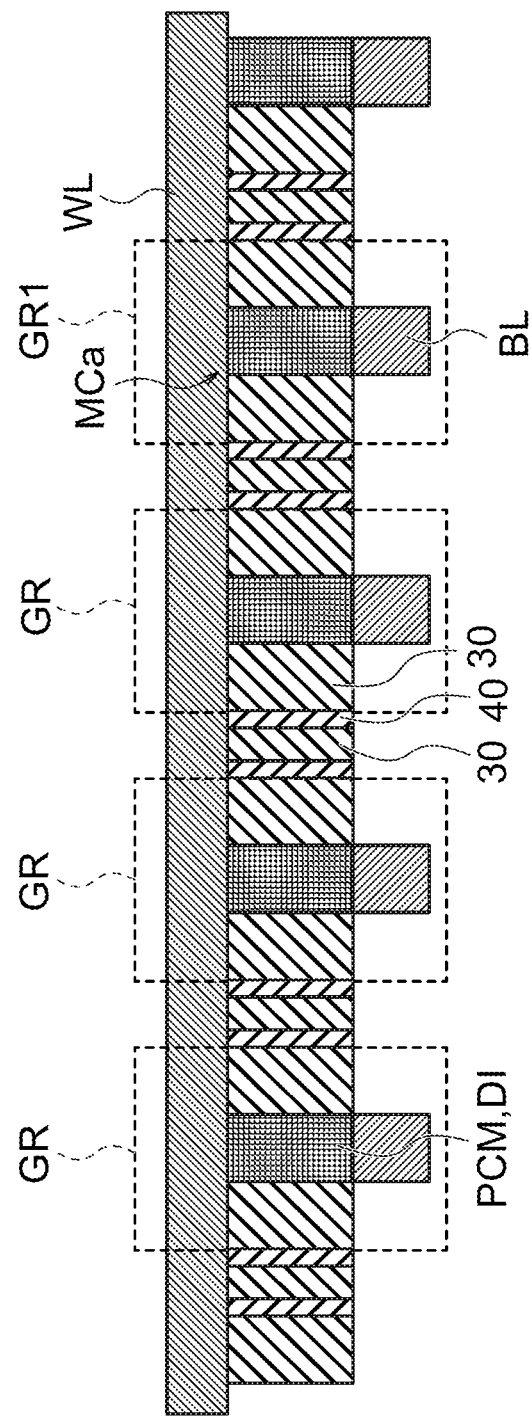
FIG. 31 is a sectional view illustrating a mode in which a five-layer structure in the eighteenth embodiment is applied between memory cell groups in the semiconductor storage device according to the twentieth embodiment.
Figure 32:
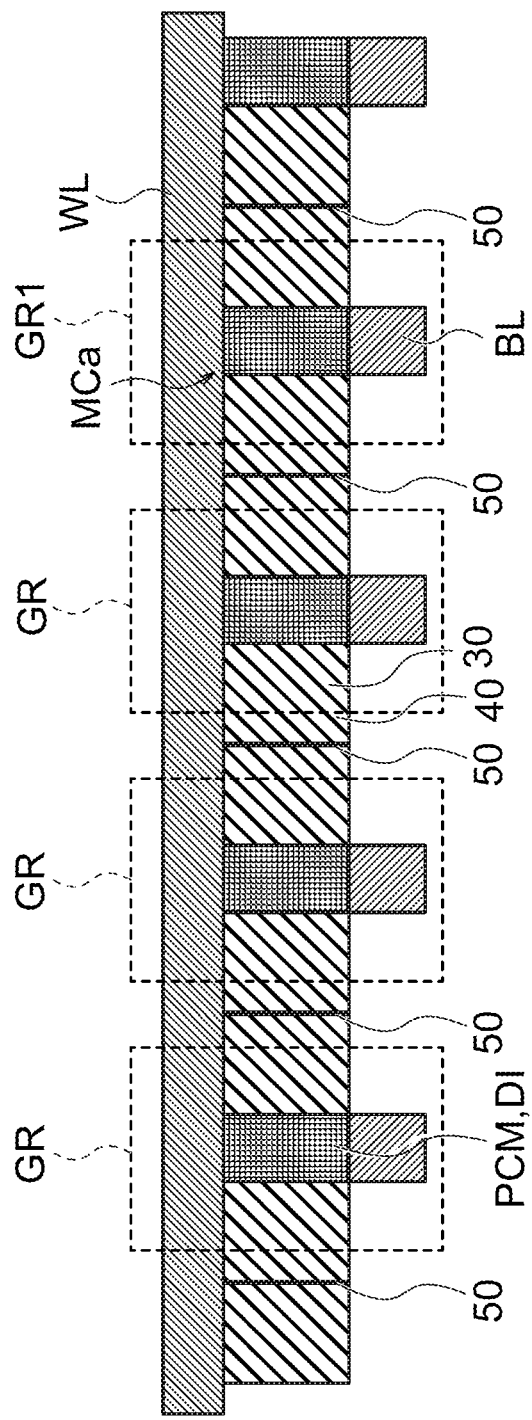
FIG. 32 is a sectional view illustrating a mode in which an interface in the nineteenth embodiment is applied between memory cell groups in the semiconductor storage device according to the twentieth embodiment.

The second structure between memory cell groups GR in the twentieth embodiment may have a five-layer structure in the X direction as in the eighteenth embodiment or may have an interface of the insulating films 30 as in the nineteenth embodiment. For example, FIG. 31 is a sectional view illustrating a mode in which the five-layer structure in the eighteenth embodiment is applied between memory cell groups in the semiconductor storage device 1 according to the twentieth embodiment. FIG. 32 is a sectional view illustrating a mode in which the interface 50 in the nineteenth embodiment is applied between memory cell groups in the semiconductor storage device 1 according to the twentieth embodiment. In this way, the effect of the present embodiment is not lost even when the second structure according to the eighteenth or nineteenth embodiment is applied between memory cell groups in the semiconductor storage device 1 according to the twentieth embodiment. The second structure in the eighteenth or nineteenth embodiment may be provided discontinuously in the Y direction or may be provided continuously.

Twenty-First Embodiment

Figure 33:
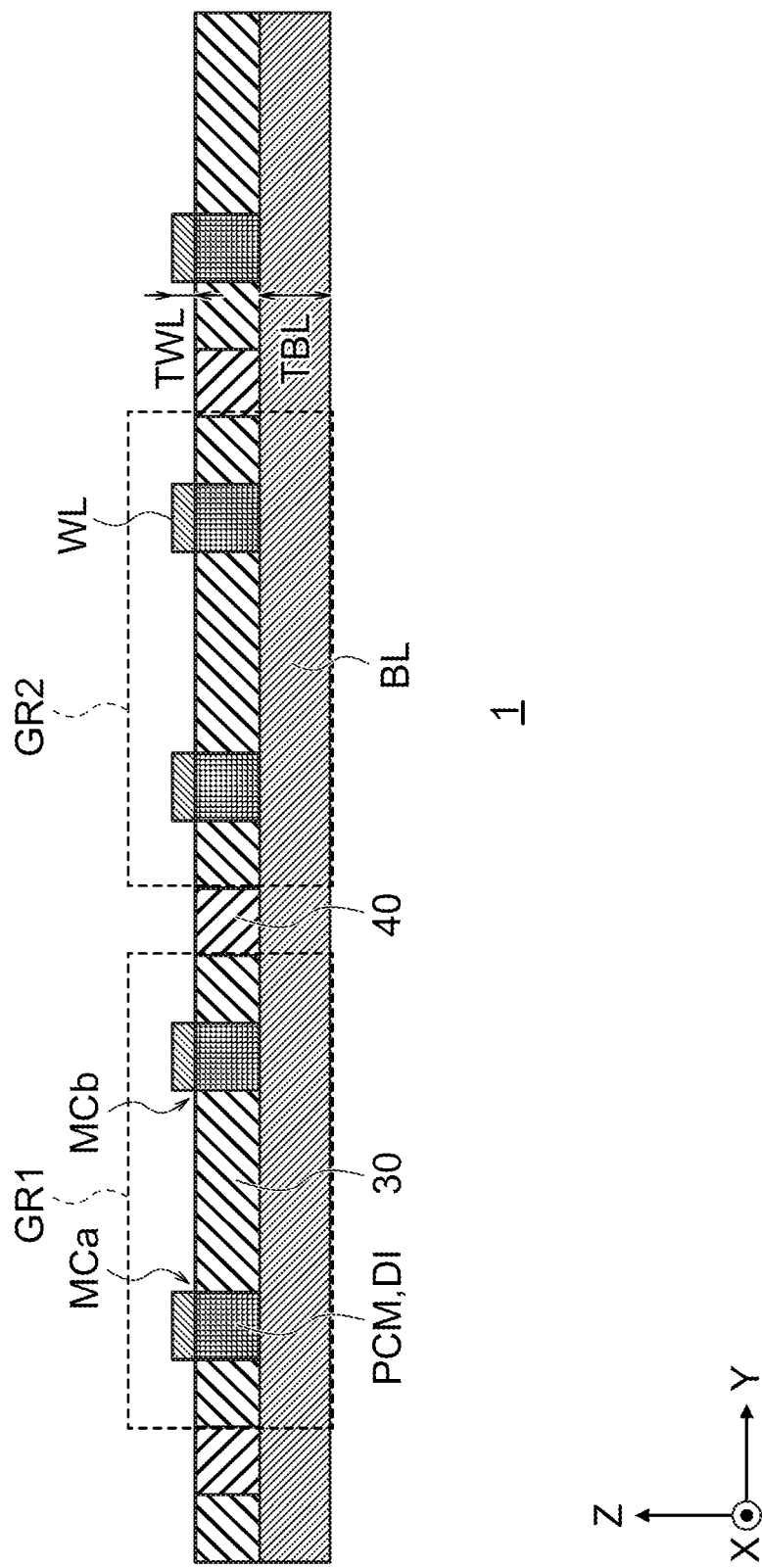
FIG. 33 is a sectional view illustrating a configuration example of a semiconductor storage device according to a twenty-first embodiment.

FIG. 33 is a sectional view illustrating a configuration example of the semiconductor storage device 1 according to a twenty-first embodiment. In the twenty-first embodiment, a thickness TWL of the word lines WL is smaller than a thickness TBL of the bit lines BL. Therefore, the wiring resistance of the word lines WL is higher than that of the bit lines BL. In this case, transistors Tr1_$m$ and Tr2_$m$ of the word line driver WLD are dispersedly arranged at the first ends $E_{WL1}$ and the second ends $E_{WL2}$ of the word lines WL. Accordingly, even when voltage drop of the selection voltage in the word lines WL is large, a memory cell MCb far from the word line driver WLD can be efficiently heated with heat of a memory cell MCa near the word line driver WLD by driving the memory cell MCa and the memory cell MCb at the same time.

On the other hand, the wiring resistance of the bit lines BL is relatively low and transistors Tr3_$m$ and Tr4_$m$ of the bit line driver BLD do not need to be dispersedly arranged at the third and fourth ends $E_{BL1}$ and $E_{BL2}$. The transistors Tr3_$m$ and Tr4_$m$ of the bit line driver BLD may of course be dispersedly arranged similarly to the word line driver WLD.

The transistors Tr1_$m$ and Tr2_$m$ of the word line driver WLD may be provided at the first and second ends $E_{WL1}$ and $E_{WL2}$ on both sides of each of the word lines WL. In this case, one word line WL is driven from both the first and second ends $E_{WL1}$ and $E_{WL2}$ to transmit the selection voltage. Therefore, even when the wiring resistance of the word lines WL is high, voltage drop in the word lines WL can be decreased.

Twenty-Second Embodiment

Figure 34:
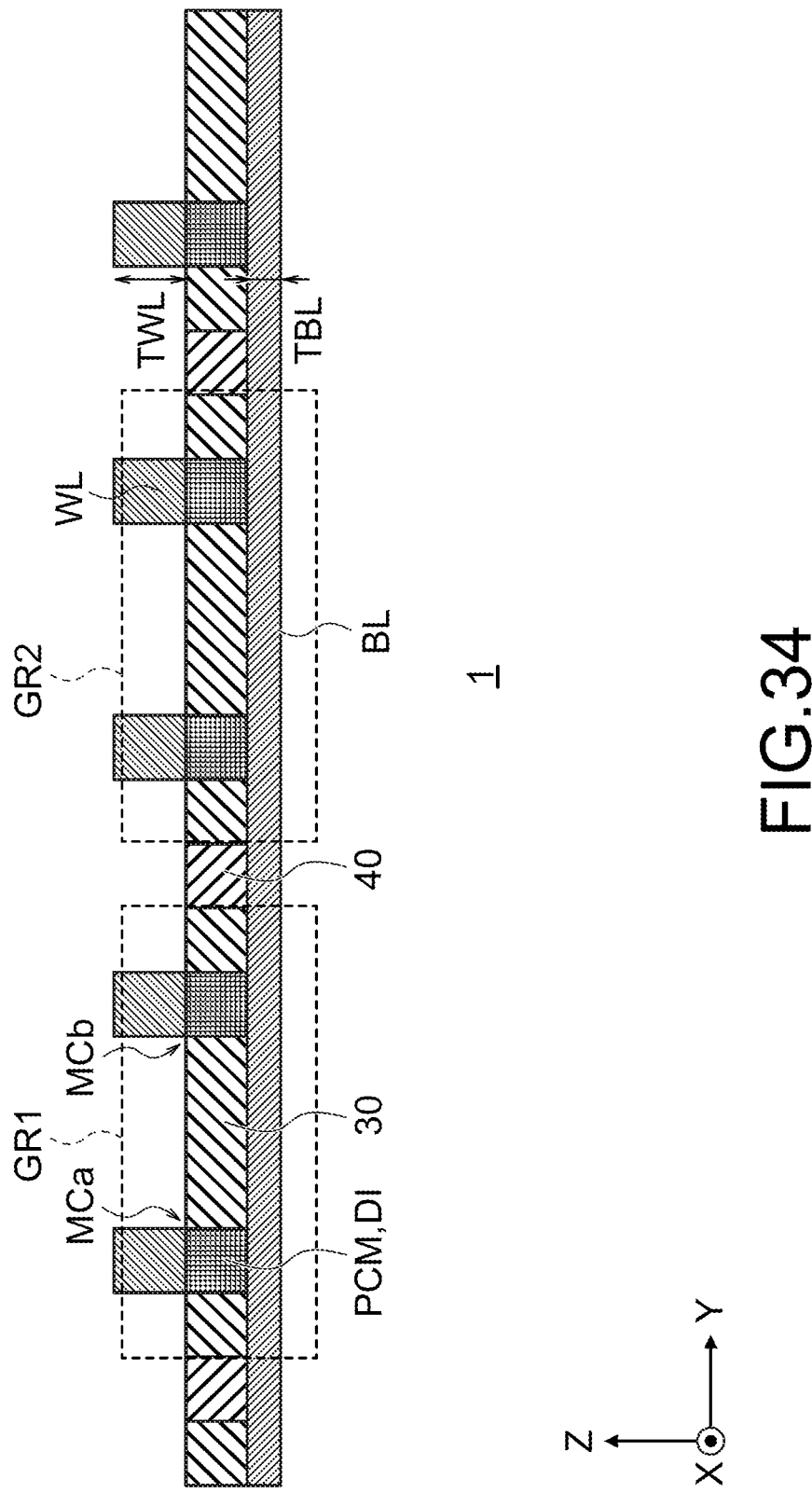
FIG. 34 is a sectional view illustrating a configuration example of a semiconductor storage device according to a twenty-second embodiment.

FIG. 34 is a sectional view illustrating a configuration example of the semiconductor storage device 1 according to a twenty-second embodiment. In the twenty-second embodiment, the thickness TBL of the bit lines BL is smaller than the thickness TWL of the word lines WL. Therefore, the wiring resistance of the bit lines BL is higher than that of the word lines WL. In this case, transistors Tr3_$m$ and Tr4_$m$ of the bit line driver BLD are dispersedly arranged at the third ends $E_{BL1}$ and the fourth ends $E_{BL2}$ of the bit lines BL. Accordingly, even when voltage drop of the selection voltage in the bit lines BL is large, low-temperature memory cells can be efficiently heated by driving memory cells near the bit line driver BLD and memory cells far from the bit line driver BLD at the same time.

On the other hand, the wiring resistance of the word lines WL is relatively low and transistors Tr1_$m$ and Tr2_$m$ of the word line driver WLD do not need to be dispersedly arranged at the first ends $E_{WL1}$ and the second ends $E_{WL2}$. The transistors Tr1m and Tr2_m of the word line driver WLD may of course be dispersedly arranged similarly to the bit line driver BLD.

The transistors Tr3_m and Tr4_m of the bit line driver BLD may be provided at the third ends $E_{BL1}$ and the fourth ends $E_{BL2}$ on both sides of each of the bit lines BL (see FIG. 18). In this case, one bit line BL is driven from both the third and fourth ends $E_{BL1}$ and $E_{BL2}$ to transmit the selection voltage. Therefore, even when the wiring resistance of the bit lines BL is high, voltage drop in the bit lines BL can be decreased.

Twenty-Third Embodiment

Figure 35:
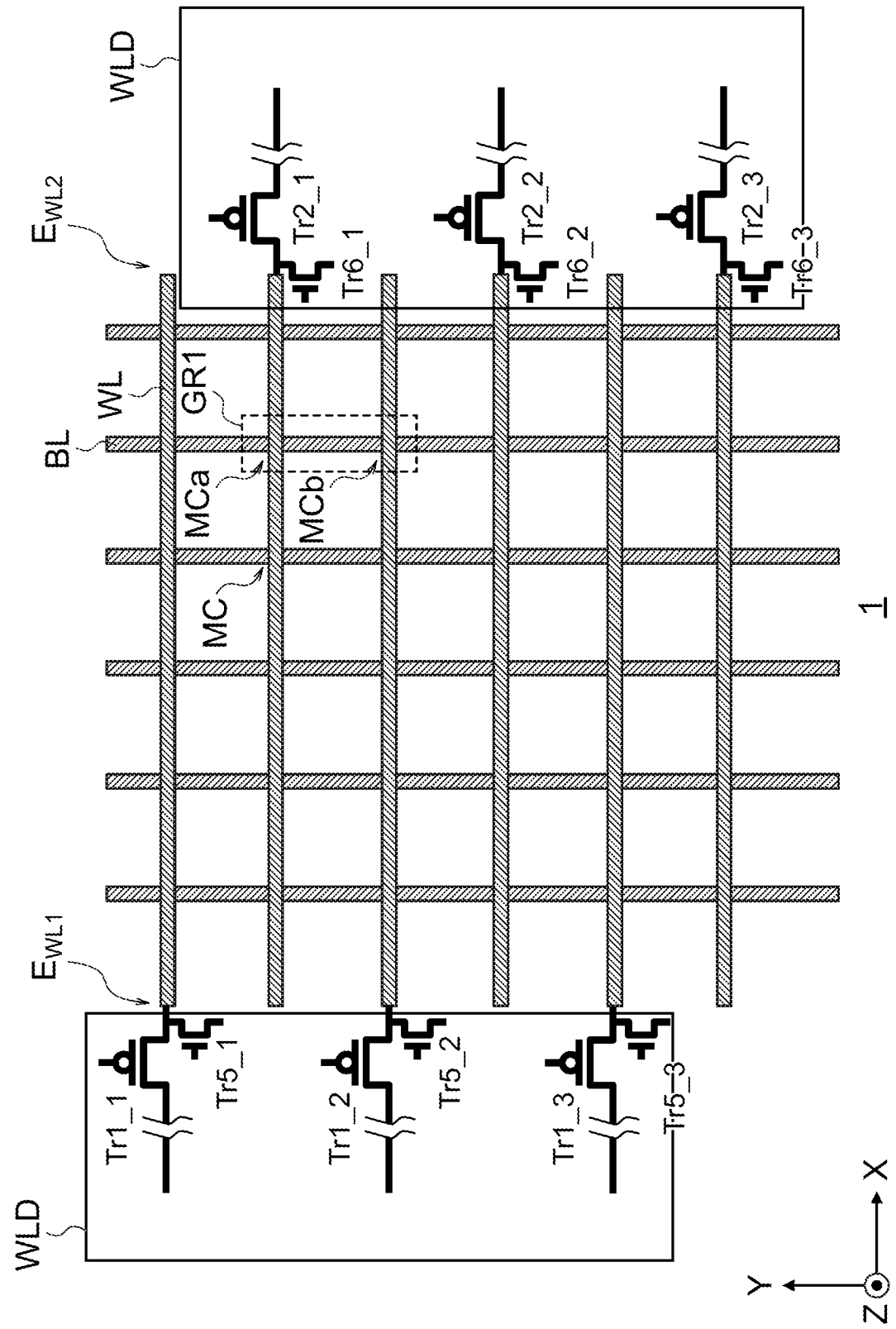
FIG. 35 is a sectional view illustrating a configuration example of a semiconductor storage device according to a twenty-third embodiment.

FIG. 35 is a sectional view illustrating a configuration example of the semiconductor storage device 1 according to a twenty-third embodiment. The semiconductor storage device 1 according to the twenty-third embodiment includes a plurality of transistors Tr5_1 to Tr5_3 and Tr6_1 to Tr6_3 serving as third switching elements. The transistors Tr5_1 to Tr5_3 and Tr6_1 to Tr6_3 are switching elements that transmit a non-selection voltage for not performing data write to memory cells MC. While, for example, n-type transistors are used as the transistors Tr5_1 to Tr5_3 and Tr6_1 to Tr6_3, the transistors are not limited thereto and p-type transistors may be used. The numbers of the transistors Tr5_1 to Tr5_3 and Tr6_1 to Tr6_3 may be same as those of the transistors Tr1_1 to Tr1_3 and Tr2_1 to Tr2_3, respectively. The non-selection voltage is a voltage applied to word lines WL or bit lines BL connected to memory cells MC to which data write is not performed.

The transistors Tr5_1 to Tr5_3 are arranged on the side of the first ends $E_{WL1}$ of the word lines WL along with the transistors Tr1_1 to Tr1_3 and are respectively connected to word lines WL connected to the transistors Tr1_1 to Tr1_3. The transistors Tr6_1 to Tr6_3 are arranged on the side of the second ends $E_{WL2}$ of the word lines WL along with the transistors Tr2_1 to Tr2_3 and are respectively connected to word lines WL connected to the transistors Tr2_1 to Tr2_3.

In this way, the transistors Tr5_1 to Tr5_3 and the transistors Tr6_1 to Tr6_3 that transmit the non-selection voltage are also connected alternately to different word lines WL, respectively, in the present embodiment.

Other configurations of the twenty-third embodiment may be identical to corresponding configurations of the first embodiment. Accordingly, the twenty-third embodiment can obtain identical effects as those of the first embodiment.

Twenty-Fourth Embodiment

Figure 36:
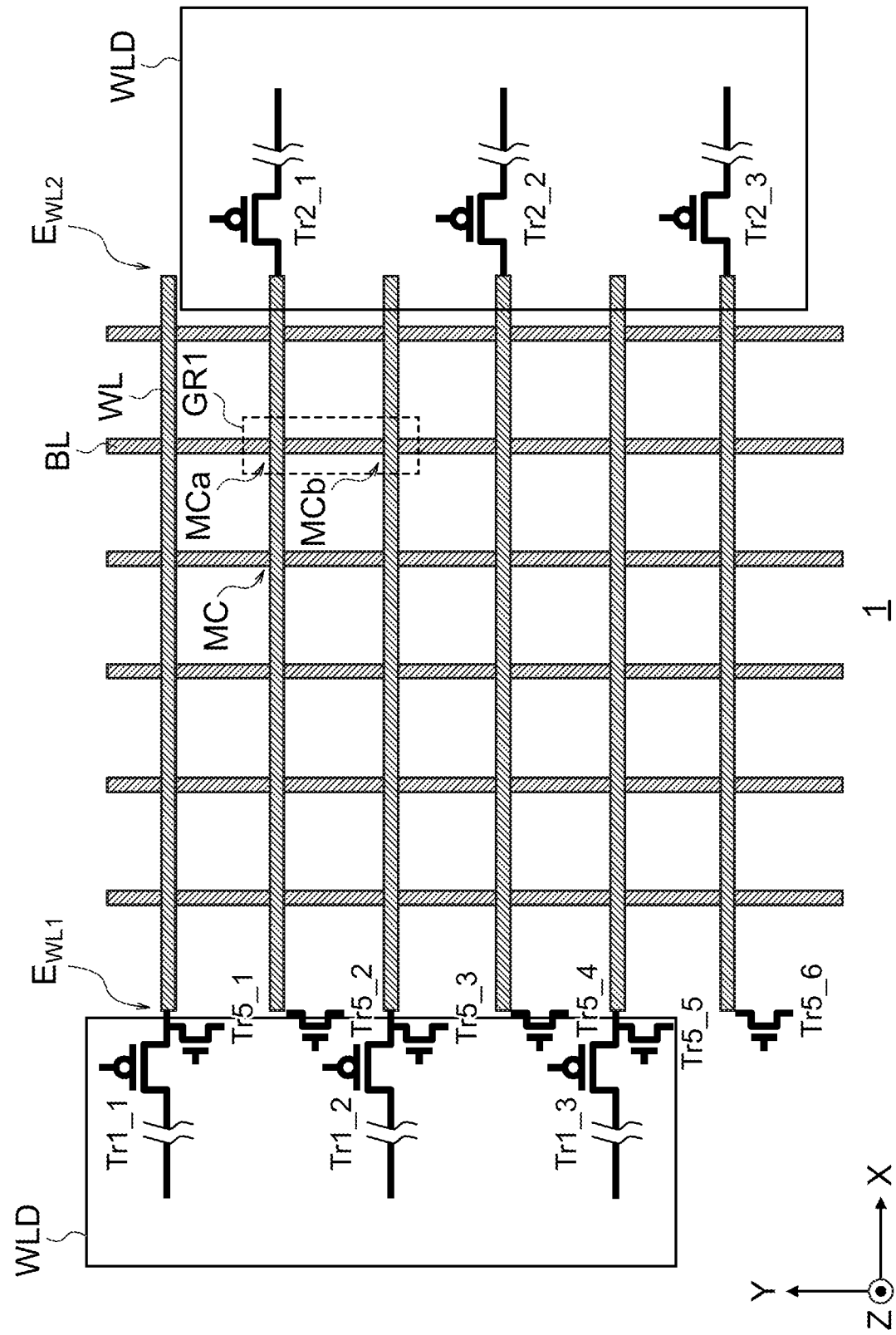
FIG. 36 is a sectional view illustrating a configuration example of a semiconductor storage device according to a twenty-fourth embodiment.

FIG. 36 is a sectional view illustrating a configuration example of the semiconductor storage device 1 according to a twenty-fourth embodiment. In the twenty-fourth embodiment, a plurality of transistors Tr5_1 to Tr5_6 are arranged only on the side of the first ends $E_{WL1}$ of the word lines WL and are respectively connected to the word lines WL. That is, the transistors Tr5_1 to Tr5_6 are arranged at either the first ends $E_{WL1}$ or the second ends $E_{WL2}$ on one side of the word lines WL to transmit the non-selection voltage to the associated word lines WL, respectively. Accordingly, the arrangement area of the transistors Tr5_1 to Tr5_6 can be reduced.

Other configurations of the twenty-fourth embodiment may be identical to corresponding configurations of the first embodiment. Accordingly, the twenty-fourth embodiment can obtain identical effects as those of the first embodiment.

Twenty-Fifth Embodiment

Figure 37:
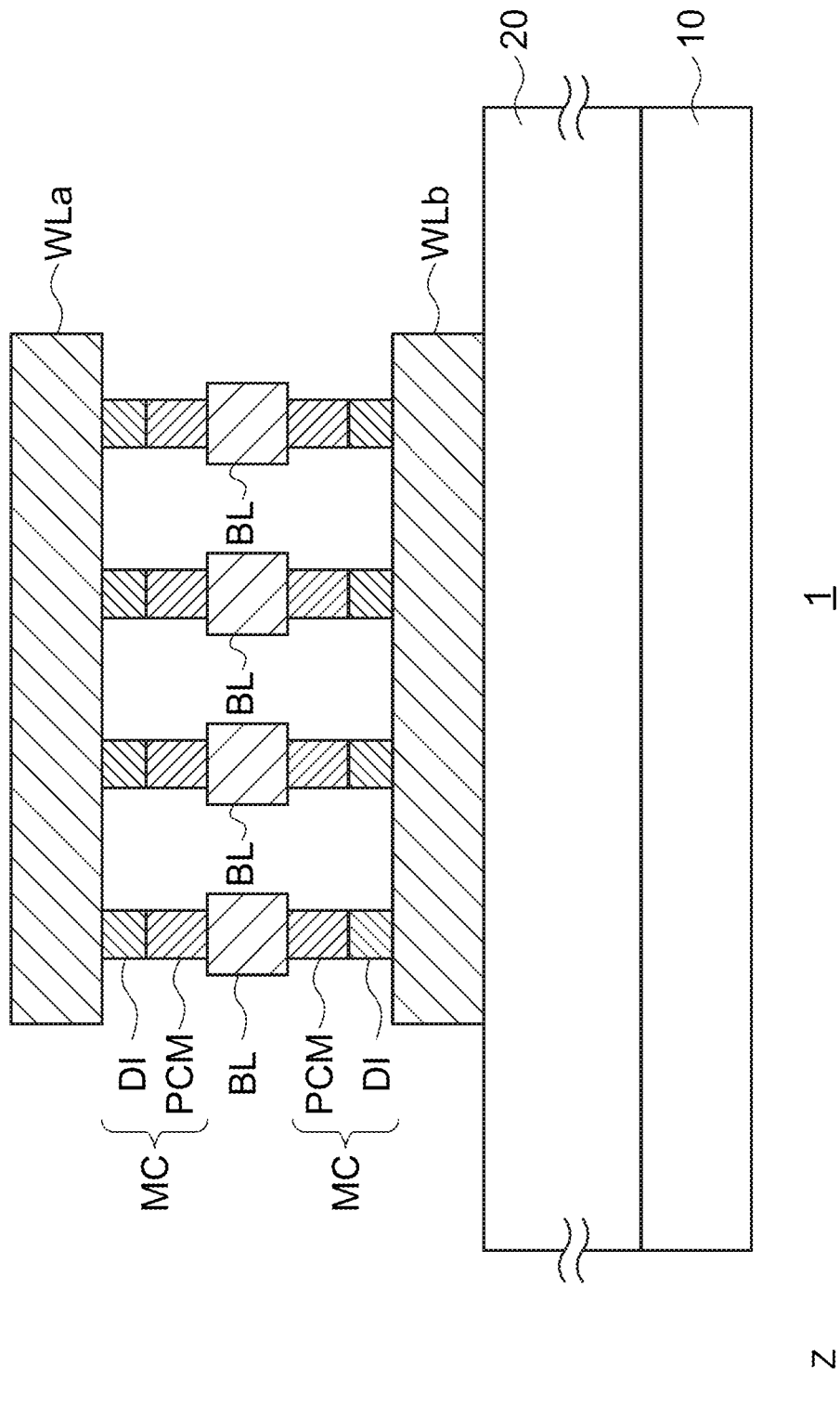
FIG. 37 is a sectional view illustrating a configuration example of a semiconductor storage device according to a twenty-fifth embodiment.

FIG. 37 is a sectional view illustrating a configuration example of the semiconductor storage device 1 according to a twenty-fifth embodiment. In the twenty-fifth embodiment, the word lines WL are arrayed substantially in parallel to the surface of the semiconductor substrate 10 and are provided above and below on both sides of the bit lines BL. Word lines provided above the bit lines BL are denoted by WLa and word lines provided below the bit lines BL are denoted by WLb. The word lines WLa and WLb are provided in the same number and overlap with each other in a planar view seen from above the surface of the semiconductor substrate 10. The bit lines BL are provided only on one side of the word lines WL.

In the present embodiment, memory cells MC are provided between the bit lines BL and the word lines WLa and between the bit lines BL and the word lines WLb and are arranged in two layers. Transistors Tr1_m and Tr2_m of the word line driver WLD may be dispersedly arranged on either the word lines WLa or WLb or both thereof in the same manner as that in any of the embodiments described above. Accordingly, the twenty-fifth embodiment also can achieve the effects of any of the embodiments described above.

The bit lines BL instead of the word lines WL may be provided both above and below the word lines WL.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor storage device comprising:
a substrate;
a plurality of first lines arrayed along a surface of the substrate;
a plurality of second lines arrayed along the surface of the substrate either above or below the first lines and intersecting with the first lines;
a plurality of resistance change memory cells provided to correspond to intersection regions between the first lines and the second lines, respectively;
a plurality of first switching elements connected to first ends of the first lines and transmitting a first voltage for writing or reading data to at least one memory cell among the memory cells; and
a plurality of second switching elements connected to second ends of the first lines on an opposite side to the first ends and transmitting the first voltage to at least another one memory cell among the memory cells, wherein
the first switching elements and the second switching elements are connected to different ones of the first lines, respectively,
the first switching elements are not connected to the first lines to which the second switching elements are connected, and the second switching elements are not connected to the first lines to which the first switching elements are connected.

2. The device of claim 1, wherein the first switching elements and the second switching elements are arranged alternately by m (m is an integer equal to or more than 1) elements with respect to the first lines.

3. The device of claim 1, wherein the first and second switching elements apply the first voltage at a same time to plural ones of the memory cells adjacent in an extending direction of the second lines.

4. The device of claim 3, wherein respective numbers of the first and second switching elements applying the first voltage at the same time to the plural ones of the memory cells are equal.

5. The device of claim 1, further comprising a plurality of third switching elements arranged on either the side of the first ends or the side of the second ends of the first lines and transmitting a third voltage to the memory cells, the third voltage being a voltage level not for performing a data write operation.

6. The device of claim 1, further comprising a plurality of third switching elements transmitting a third voltage to the memory cells, the third voltage being a voltage level not for performing a data write operation, wherein
the third switching elements are arranged for ones of the first lines, to which the first switching elements are connected, on the side of the first ends and are arranged for ones of the first lines, to which the second switching elements are connected, on the side of the second ends.

7. The device of claim 1, comprising:
a plurality of fourth switching elements arranged on a side of third ends of the second lines and transmitting a second voltage for writing or reading data to at least one memory cell among the memory cells; and
a plurality of fifth switching elements arranged on a side of fourth ends of the second lines on an opposite side to the third ends and transmitting the second voltage to at least another one memory cell among the memory cells, wherein
the fourth switching elements and the fifth switching elements are connected to different ones of the second lines, respectively.

8. The device of claim 7, wherein the fourth switching elements and the fifth switching elements are arranged alternately by n (n is an integer equal to or more than 1) elements with respect to the second lines.

9. The device of claim 7, wherein the fourth and fifth switching elements apply the second voltage at a same time to plural ones of the memory cells adjacent in an extending direction of the first lines.

10. The device of claim 9, wherein respective numbers of the fourth and fifth switching elements applying the second voltage at the same time to the plural ones of the memory cells are equal.

11. The device of claim 1, wherein a resistance of the first lines is higher than that of the second lines.

12. The device of claim 11, wherein a width of the first lines is smaller than that of the second lines, or a thickness of the first lines is smaller than that of the second lines.

13. The device of claim 3, wherein a gap between plural ones of the first lines transmitting the first voltage at the same time and being adjacent to each other is narrower than a gap between plural ones of the first lines not transmitting the first voltage at the same time.

14. The device of claim 3, further comprising:
a first structure between plural ones of the memory cells, to which the first voltage is applied at the same time; and
a second structure provided between plural ones of the memory cells, to which the first voltage is applied at different timings, and being different from the first structure.

15. The device of claim 14, wherein
the first structure comprises first insulating layers, and
the second structure comprises second insulating layers lower in a thermal conductivity than the first insulating films.

16. The device of claim 14, wherein number of layers included in the first structure is less than number of layers included in the second structure.

17. The device of claim 3, wherein a distance between plural ones of the memory cells, to which the first voltage is applied at the same time is shorter than a distance between plural ones of the memory cells, to which the first voltage is applied at different timings.

18. The device of claim 3, wherein an area of a face of each of the memory cells facing in an extending direction of the second lines is larger than an area of a face of each of the memory cells facing in an extending direction of the first lines.

19. The device of claim 3, wherein the second lines are arrayed both above and below the first lines.

20. A semiconductor storage device comprising:
a substrate;
a plurality of first lines provided on a surface of the substrate;
a plurality of second lines intersecting with the first lines;
resistance change memory cells provided to correspond to intersection regions between the first lines and the second lines, respectively;
a plurality of first switching elements connected to first ends of the first lines and transmitting a first voltage for writing or reading data to at least one memory cell among the memory cells; and
a plurality of second switching elements connected to second ends of the first lines on an opposite side to the first ends and transmitting the first voltage to at least another one memory cell among the memory cells, wherein
the first switching elements and the second switching elements are connected to different ones of the first lines, respectively,
the first switching elements are not connected to the first lines to which the second switching elements are connected,
the second switching elements are not connected to the first lines to which the first switching elements are connected, and
the first and second switching elements apply the first voltage at a same time to plural ones of the memory cells located in the vicinity in an extending direction of the second lines.

21. The device of claim 20, wherein the first switching elements and the second switching elements are arranged alternately by m (m is an integer equal to or more than 1) elements with respect to the first lines.

22. The device of claim 20, wherein respective numbers of the first and second switching elements applying the first voltage at the same time to the plural ones of the memory cells are equal.

23. The device of claim 20, wherein the first and second switching elements apply the first voltage at the same time to plural ones of the memory cells successive in an extending direction of the second lines.

24. The device of claim 20, comprising:
a plurality of fourth switching elements arranged on a side of third ends of the second lines and transmitting a second voltage for writing or reading data to at least one memory cell among the memory cells; and
a plurality of fifth switching elements arranged on a side of fourth ends of the second lines on an opposite side to the third ends and transmitting the second voltage to at least another one memory cell among the memory cells, wherein
the fourth switching elements and the fifth switching elements are connected to different ones of the second lines, respectively, and
the fourth and fifth switching elements apply the second voltage at a same time to plural ones of the memory cells located in the vicinity in an extending direction of the first lines.

25. The device of claim 24, wherein the fourth and fifth switching elements apply the second voltage at the same time to plural ones of the memory cells successive in the extending direction of the first lines.

26. The device of claim 24, wherein the first, second, fourth, and fifth switching elements apply the first or second voltage at the same time to plural ones of the memory cells respectively corresponding to intersection regions between plural adjacent ones of the first lines and plural adjacent ones of the second lines.

* * * * *